US012808751B2

(12) United States Patent
Kobori et al.

(10) Patent No.: US 12,808,751 B2
(45) Date of Patent: Nov. 24, 2026

(54) ANOMALY DETERMINATION APPARATUS, ANOMALY DETERMINATION METHOD, AND PROGRAM

(71) Applicant: DAIKIN INDUSTRIES, LTD., Osaka (JP)

(72) Inventors: Hirokazu Kobori, Osaka (JP); Takeshi Araki, Osaka (JP); Yumemi Iwaida, Osaka (JP); Hiroki Ikebe, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 807 days.

(21) Appl. No.: 18/040,197

(22) PCT Filed: Aug. 3, 2021

(86) PCT No.: PCT/JP2021/028861
§ 371 (c)(1),
(2) Date: Feb. 1, 2023

(87) PCT Pub. No.: WO2022/030516
PCT Pub. Date: Feb. 10, 2022

(65) Prior Publication Data

US 2023/0280238 A1 Sep. 7, 2023

(30) Foreign Application Priority Data

Aug. 3, 2020 (JP) ................................ 2020-131881

(51) Int. Cl.
*G01M 13/04* (2019.01)
*F25B 49/02* (2006.01)
*G01R 23/02* (2006.01)

(52) U.S. Cl.
CPC ............ *G01M 13/04* (2013.01); *F25B 49/02* (2013.01); *G01R 23/02* (2013.01); *F25B 2700/171* (2013.01)

(58) Field of Classification Search
CPC ........ G01M 13/04; G01R 23/02; F25B 49/02; F25B 2700/171
See application file for complete search history.

(56) References Cited

U.S. PATENT DOCUMENTS

| | | | | |
|---|---|---|---|---|
| 5,744,723 | A | 4/1998 | Piety | |
| 2003/0041603 | A1* | 3/2003 | Tada | F25B 27/00 62/134 |

(Continued)

FOREIGN PATENT DOCUMENTS

| | | | | |
|---|---|---|---|---|
| DE | 10239502 | A1 * | 3/2003 | F25B 27/00 |
| EP | 0302493 | | 6/1994 | |

(Continued)

OTHER PUBLICATIONS

International Preliminary Report on Patentability for PCT/JP2021/028861 mailed on Feb. 16, 2023.

(Continued)

*Primary Examiner* — Jamel E Williams
(74) *Attorney, Agent, or Firm* — IPUSA, PLLC

(57) ABSTRACT

Provide a technology that enables more appropriate determinations relating to the anomaly of a mechanical element in a rotating machine. The control device 40 according to an embodiment of the present disclosure includes the anomaly determining unit 403 configured to make a determination relating to an anomaly of a mechanical element of the compressor 10, based on an electrical feature amount of the compressor 10 that is electrically driven by the electric motor 20, wherein the electrical feature amount is a particular frequency component of a signal representing a physical amount that is correlated with a current of the electric motor 20 configured to drive the compressor 10, the particular frequency component is a predetermined positive integral multiple component of a rotational frequency of the compressor 10, and the anomaly determining unit 403 makes the (Continued)

determination relating to an anomaly of the mechanical element of the compressor 10, in consideration of a variation of a relationship between the anomaly of the mechanical element and the electrical feature amount of the compressor 10 (the electric motor 20), the variation being caused by a change in the rotational frequency of the compressor 10.

7 Claims, 7 Drawing Sheets

(56) References Cited

U.S. PATENT DOCUMENTS

| | | | | |
|---|---|---|---|---|
| 2004/0199480 | A1 | 10/2004 | Unsworth et al. | |
| 2015/0229258 | A1 | 8/2015 | Araki et al. | |
| 2017/0146265 | A1* | 5/2017 | Fujitaka | F04C 27/005 |
| 2018/0347879 | A1 | 12/2018 | Tada et al. | |
| 2020/0217895 | A1 | 7/2020 | Kanemaru et al. | |

FOREIGN PATENT DOCUMENTS

| | | | | |
|---|---|---|---|---|
| FR | 2833049 | A1 * | 6/2003 | F04C 29/0085 |
| JP | 2000-298511 | | 10/2000 | |
| JP | 2000298511 | A * | 10/2000 | |
| JP | 2001-286920 | | 10/2001 | |
| JP | 2009097485 | A * | 5/2009 | F04C 23/008 |
| JP | 5494760 | | 5/2014 | |
| JP | 2015-4694 | | 1/2015 | |
| JP | 2015-075406 | | 4/2015 | |
| JP | 2015-227889 | | 12/2015 | |
| JP | 2015227889 | A * | 12/2015 | |
| JP | 2016-090546 | | 5/2016 | |
| JP | 2016090546 | A * | 5/2016 | |
| JP | 5985158 | | 9/2016 | |
| WO | WO-2017042949 | A1 * | 3/2017 | F04C 23/008 |

OTHER PUBLICATIONS

International Search Report for PCT/JP2021/028861 mailed on Oct. 12, 2021.

Extended European Search Report mailed on Jul. 31, 2024 with respect to the corresponding European Patent application No. 21854531.7.

* cited by examiner

ANOMALY DETERMINATION APPARATUS, ANOMALY DETERMINATION METHOD, AND PROGRAM

TECHNICAL FIELD

The present disclosure relates to an anomaly determination apparatus, etc.

BACKGROUND ART

For example, a technique for diagnosing electrical anomalies in electrical equipment from electrical feature amounts is known (see Patent Document 1).

CITATION LIST

Patent Documents

[Patent Document 1]
Japanese Patent No. 5985158

SUMMARY OF INVENTION

Technical Problem

Incidentally, it is conceivable to make a determination on anomalies such as the deterioration and stress of a mechanical element of an electrically driven rotating machine, from the electrical feature amounts.

However, for example, when an anomaly such as deterioration or stress of a mechanical element of a rotating machine appears as an electrical feature, the anomaly may appear in various ways depending on the operation state of the rotating machine. Therefore, for example, if the same reference is used for determining anomalies based on electrical feature amounts, regardless of the operation state of the rotating machine, the accuracy of the determination relating to anomalies may decrease and it may not be possible to make a proper determination relating to anomalies.

The object of the present disclosure is to provide a technology that enables more appropriate determinations relating to the anomaly of a mechanical element in a rotating machine.

Solution to Problem

In an embodiment according to the present disclosure, there is provided an anomaly determination apparatus including a determining unit configured to make a determination relating to an anomaly of a mechanical element of a device installed with a rotating machine, based on an electrical feature amount of the rotating machine that is electrically driven, wherein the electrical feature amount is a particular frequency component of a signal that is correlated with a current of an electric motor configured to drive the rotating machine, the particular frequency component is a predetermined positive integral multiple component of a rotational frequency of the rotating machine, and the determining unit makes the determination in consideration of a variation of a relationship between the anomaly of the mechanical element and the electrical feature amount of the rotating machine, the variation being caused by a change in the rotational frequency of the rotating machine.

According to the present embodiment, the anomaly determination apparatus can consider the variation of the relationship between the anomaly of the mechanical element and the electrical feature amount of the rotating machine caused by the change of the rotational frequency of the rotating machine when making the determination relating to the anomaly of the rotating machine based on the electrical feature amount. Therefore, the anomaly determination apparatus can improve the accuracy of the determination on the anomaly of the rotating machine.

Further, in the above embodiment, the variation is a deviation from a predetermined reference state of the relationship between the anomaly of the mechanical element and the electrical feature amount, caused by the change in the rotational frequency of the rotating machine, and the predetermined reference state may be the relationship between the anomaly of the mechanical element and the electrical feature amount in a case of a particular rotational frequency of the rotating machine.

Further, in the above embodiment, the anomaly determination apparatus further includes a correcting unit configured to correct the deviation from the predetermined reference state of the relationship between the anomaly of the mechanical element and the electrical feature amount, caused by the change in the rotational frequency of the rotating machine, wherein the determining unit may make the determination based on the relationship between the anomaly of the mechanical element and the electrical feature amount, in which the deviation has been corrected by the correcting unit.

Further, in the above embodiment, the anomaly determination apparatus further includes a generating unit configured to generate a determination reference for making the determination from the electrical feature amount, based on a relationship between an operation state of the rotating machine and the electrical feature amount in a normal state, wherein the correcting unit corrects the electrical feature amount or the determination reference so as to correct the deviation of a relationship between the anomaly of the mechanical element and the determination reference, caused by the change in the rotational frequency of the rotating machine, and the determining unit may make the determination by comparing the electrical feature amount and the determination reference, after the correcting unit has corrected the electrical feature amount or the determination reference.

Further, in the above embodiment, the generating unit generates the determination reference in a case where the rotational frequency of the rotating machine is the particular rotational frequency, the correcting unit corrects the electrical feature amount to a state corresponding to the case where the rotational frequency of the rotating machine is the particular rotational frequency, and the determining unit may make the determination by comparing the electrical feature amount corrected by the correcting unit and the determination reference.

Further, in the above embodiment, the generating unit generates the determination reference in a case where the rotational frequency of the rotating machine is the particular rotational frequency, the correcting unit corrects the determination reference to be in line with the rotational frequency of the rotating machine, and the determining unit may make the determination by comparing the electrical feature amount and the determination reference corrected by the correcting unit.

Further, in the above embodiment, the correcting unit may change an amount of correction in line with the change in the rotational frequency of the rotating machine.

Further, in the above embodiment, the rotating machine is a compressor, and the operation state of the rotating machine may include both a signal correlated with a pressure state on a low pressure side of the compressor or a state correlated with the pressure state on the low pressure side, and a signal correlated with a pressure state on a high pressure side of the compressor or a state correlated with the pressure state on the high pressure side.

Further, in the above embodiment, information relating to a boundary between anomaly and normality of the rotating machine with respect to the electrical feature amount is held, the boundary changes in line with the change in the rotational frequency of the rotating machine, and the determining unit may make the determination according to whether the electrical feature amount is on a side of anomaly of the boundary or on a side of normality of the boundary.

Further, in the above embodiment, the determining unit may make the determination in consideration of the variation based on a mechanical characteristic of the mechanical element.

Further, in the above embodiment, the mechanical characteristic may include an inertia of the mechanical element.

Further, in the above embodiment, the determining unit may make the determination in consideration of the variation based on a transmission characteristic until the anomaly of the mechanical element appears in the electrical feature amount.

Further, in the above embodiment, the determining unit may make the determination in consideration of the variation based on a function representing the transmission characteristic, the function being defined in advance by at least one of calculation by a theoretical formula or a measurement result of an electrical signal of the rotating machine.

Further, in the above embodiment, the anomaly of the mechanical element may be a type of anomaly in which as the rotational frequency of the rotating machine increases, the change in the electrical feature amount that occurs at a time of the anomaly becomes relatively small.

Further, in the above embodiment, the signal is a DC signal correlated with the current of the electric motor that electrically drives the rotating machine, the particular frequency component is a component that is one times the rotational frequency of the rotating machine, and the anomaly of the mechanical element may be a decrease in oil sealability of a compression chamber of the rotating machine, or a state where a liquid refrigerant enters the compression chamber and the liquid refrigerant becomes compressed.

Further, in the above embodiment, the signal is an AC signal correlated with the current of the electric motor that electrically drives the rotating machine, the particular frequency component is a frequency component that is deviated by an amount corresponding to a component that is one times the rotational frequency of the rotating machine, with respect to a fundamental wave frequency of the AC signal, and the anomaly of the mechanical element may be a decrease in oil sealability of a compression chamber of the rotating machine, or a state where a liquid refrigerant enters the compression chamber and the liquid refrigerant becomes compressed.

Further, in the above embodiment, the determining unit may determine that the oil sealability has decreased based on a decrease in the particular frequency component.

Further, in the above embodiment, the signal is a DC signal correlated with the current of the electric motor that electrically drives the rotating machine, the particular frequency component is a component that is two times or three times the rotational frequency of the rotating machine, and the anomaly of the mechanical element may be wear of a bearing of the rotating machine.

Further, in the above embodiment, the signal is an AC signal correlated with the current of the electric motor that electrically drives the rotating machine, the particular frequency component is a frequency component that is deviated by an amount corresponding to a component that is two times or three times the rotational frequency of the rotating machine, with respect to a fundamental wave frequency of the AC signal, and the anomaly of the mechanical element may be wear of a bearing of the rotating machine.

Further, in the above embodiment, the signal is calculated based on at least two phase current values or more of the electric motor that electrically drives the rotating machine, and each of the at least two phase current values or more may be obtained based on output of a single current detecting unit configured to detect a predetermined current, correlated with all of the at least two phase current values or more.

Further, in another embodiment of the present disclosure, there is provided an anomaly determination apparatus including a determining unit configured make a determination relating to an anomaly of a device installed with a displacement type compressor, wherein the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and the determining unit determines that there is an anomaly based on a decrease in a component of a driving frequency of the electric motor in the first torque.

Further, in the above embodiment, the determining unit may determine the decrease in the component of the driving frequency in the first torque, according to a decrease in a particular frequency component of a signal correlated with a current of the electric motor.

Further, in the above embodiment, the signal is a DC signal correlated with the current of the electric motor, and the particular frequency component may be a component of the driving frequency.

Further, in the above embodiment, the signal is an AC signal correlated with the current of the electric motor, and the particular frequency component may be a frequency component that is deviated by an amount corresponding to the driving frequency, with respect to a fundamental wave frequency of the AC signal.

Further, in the above embodiment, the determining unit determines the decrease in the component of the driving frequency in the first torque, according to a decrease in a particular frequency component of vibration or sound of the displacement type compressor.

Further, in yet another embodiment of the present disclosure, there is provided an anomaly determination method performed by an anomaly determination apparatus, the anomaly determination method including making a determination relating to an anomaly of a mechanical element of a device installed with a rotating machine, based on an electrical feature amount of the rotating machine that is electrically driven, wherein the electrical feature amount is a particular frequency component of a signal that is correlated with a current of an electric motor configured to drive the rotating machine, the particular frequency component is a predetermined positive integral multiple component of a rotational frequency of the rotating machine, and the making the determination includes making the determination in consideration of a variation of a relationship between the anomaly of the mechanical element and the electrical feature amount, the variation being caused by a change in the rotational frequency of the rotating machine.

Further, in yet another embodiment of the present disclosure, there is provided an anomaly determination method performed by an anomaly determination apparatus, the anomaly determination method including making a determination relating to an anomaly of a device installed with a displacement type compressor, wherein the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and the making the determination includes making the determination that there is an anomaly based on a decrease in a component of a driving frequency of the electric motor in the first torque.

Further, in yet another embodiment of the present disclosure, there is provided a program that causes an anomaly determination apparatus to execute:

making a determination relating to an anomaly of a mechanical element of a device installed with a rotating machine, based on an electrical feature amount of the rotating machine that is electrically driven, wherein the electrical feature amount is a particular frequency component of a signal that is correlated with a current of an electric motor configured to drive the rotating machine, the particular frequency component is a predetermined positive integral multiple component of a rotational frequency of the rotating machine, and the making the determination includes making the determination in consideration of a variation of a relationship between the anomaly of the mechanical element and the electrical feature amount, the variation being caused by a change in the rotational frequency of the rotating machine.

Further, in yet another embodiment of the present disclosure, there is provided a program that causes an anomaly determination apparatus to execute:

making a determination relating to an anomaly of a device installed with a displacement type compressor, wherein the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and the making the determination includes making the determination that there is an anomaly based on a decrease in a component of a driving frequency of the electric motor in the first torque.

Advantageous Effects of Invention

According to the above embodiment, it is possible to provide a technology that enables more appropriate determinations relating to the anomaly of a mechanical element in a rotating machine.

DESCRIPTION OF EMBODIMENTS

Embodiments will be described below with reference to the drawings.

[Overview of Anomaly Determination System]

First, an overview of an anomaly determination system 1 according to the present embodiment will be described with reference to FIG. 1.

Figure 1:
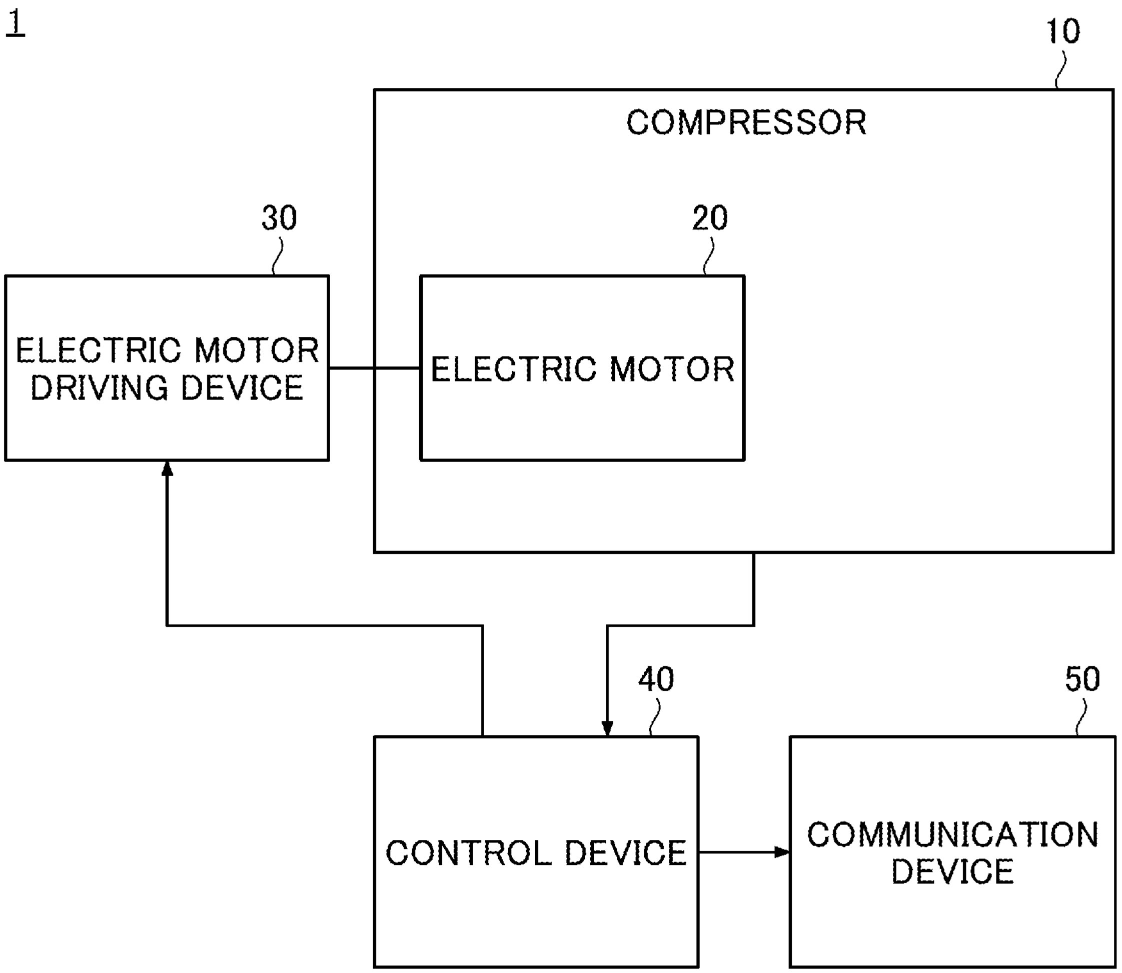
FIG. 1 illustrates an example of an anomaly determination system.

FIG. 1 is a schematic view illustrating an example of the anomaly determination system 1 according to the present embodiment.

As illustrated in FIG. 1, the anomaly determination system 1 includes a compressor 10, an electric motor 20, an electric motor driving device 30, a control device 40, and a communication device 50. The anomaly determination system 1 is mounted in, for example, an air conditioner.

The compressor 10 (an example of a rotating machine) is mounted, for example, in an air conditioner to compress a refrigerant.

The compressor 10 is, for example, a displacement type compressor. The displacement type compressor has, for example, a structure in which there is a gap in the compression chamber and the compression chamber is sealed with oil. Further, the displacement type compressor has a structure in which, for example, the compression mechanism and the electric motor 20 are mechanically connected, and the compression torque generated during the compression process (one example of the first torque) and the motor torque generated by the electric motor 20 (one example of the second torque) are correlated.

Further, various sensors for detecting the operation state of the compressor 10, for example, are built into the compressor 10, and the detection signals of the various sensors are taken into the control device 40. The operation state of the compressor 10 includes, for example, the pressure and temperature of the compressor 10, the rotational frequency of the compressor 10, the input current of the compressor 10 (the three phase currents of the electric motor 20), etc. The pressure of the refrigerant includes, for example, the discharge pressure and the suction pressure of the refrigerant in the compressor 10. The input current (three phase currents) may be detected by a current sensor such as a Hall CT (Current Transformer), for example. In this case, all of the three phase currents of the electric motor 20 may each be detected by a current sensor. Further, any two of the three phase currents of the electric motor 20 may each be detected by a current sensor, and the remaining one phase current may be acquired (calculated) by the control device 40 by using the relationship of the three phase currents (by using the relationship in which the sum of the three phase currents becomes 0). Further, the input current (the three phase currents) may be acquired (calculated) based on the switching pattern of the inverter circuit unit in the control device 40, while the current of the DC link is detected by a single current detecting unit such as a shunt resistor in the electric motor driving device 30. In this case, the control device 40 may acquire (calculate) the two phase currents by this method and acquire (calculate) the remaining one phase current by using the above relationship of the three phase currents.

The electric motor 20 drives the compressor 10. The electric motor 20 is mounted inside, for example, (the housing of) the compressor 10.

The electric motor driving device 30 drives the electric motor 20 based on the AC power supplied from the commercial power supply system. The electric motor driving device 30 includes, for example, a rectifying circuit unit that rectifies the input AC power and outputs DC power, a smoothing circuit unit that smooths the DC power output from the rectifying circuit unit, and an inverter circuit unit that generates three phase AC power to drive the electric motor 20 from the DC power smoothed by the smoothing circuit unit.

The control device 40 controls the compressor 10.

The functions of the control device 40 may be implemented by any piece of hardware or any combination of hardware and software, etc. The control device 40 may be configured mainly by a computer including, for example, a CPU (Central Processing Unit), a memory device (main storage device) such as a RAM (Random Access Memory), a nonvolatile auxiliary storage device such as a ROM (Read Only Memory), and an interface device for input from and output to the outside. For example, the control device 40 implements various functions by loading a program installed in the auxiliary storage device into the memory device and executing the program on the CPU. The program is installed in the control device 40 (auxiliary storage device) through a predetermined cable or the like from a predetermined exclusive-use tool (recording medium) in the process of a production line of an air conditioner equipped with the compressor 10, for example. The program may also be installed by being downloaded from an external device, for example, through the communication device 50, or from a general memory such as a USB (Universal Serial Bus) memory.

The control device 40 controls the electric motor driving device 30 based on, for example, a detection signal relating to the operation state input from the compressor 10, and controls the driving of the electric motor 20 by adjusting the power supplied to the electric motor 20. Further, instead of using a detection signal from a sensor or the like, for example, the control device 40 may perform drive control of the electric motor 20 while calculating part or all of the information relating to the operation state of the compressor 10 or estimating the information by sensorless control.

Further, the control device 40 (an example of an anomaly determination apparatus) makes a determination (hereafter, "anomaly determination") relating to, for example, an anomaly of a mechanical element of the compressor 10. The mechanical elements of the compressor 10 include, for example, a fixed part and a movable part moved by the electric motor 20. The determination relating to anomaly includes determining the presence or absence of anomaly. Further, the determination relating to anomaly includes the determination relating to the degree of anomaly (hereinafter, "anomaly degree"), which represents the degree of divergence of the mechanical element of the compressor 10 from a normal state.

Anomalies of mechanical elements include, for example, deterioration of mechanical elements. Deterioration of mechanical elements include, for example, wear of the bearing of the compressor 10 (hereafter, "bearing wear"). Further, anomalies of mechanical elements include, for example, stress in mechanical elements. The stress in the mechanical elements include, for example, a decrease in the oil sealability of the compression chamber of the compressor 10. Further, the stress of the mechanical elements includes, for example, a state where the liquid refrigerant enters the compression chamber inside the compressor 10 and the liquid refrigerant is compressed (hereafter, "liquid compression").

The communication device 50 communicates with the outside of the anomaly determination system 1, that is, with the outside of the air conditioner in which the anomaly determination system 1 is mounted, through a predetermined communication line. The predetermined communication line may include, for example, a wide area network (WAN) such as a mobile communication network terminated at a base station or the Internet network. The predetermined communication line may include, for example, a wireless or wired local area network (LAN) at the location where the air conditioner is installed. Further, the predetermined communication line may include, for example, a short-range wireless communication line such as Wi-Fi or Bluetooth®.

[Overview of Determination of Anomaly of Compressor]

Figure 2:
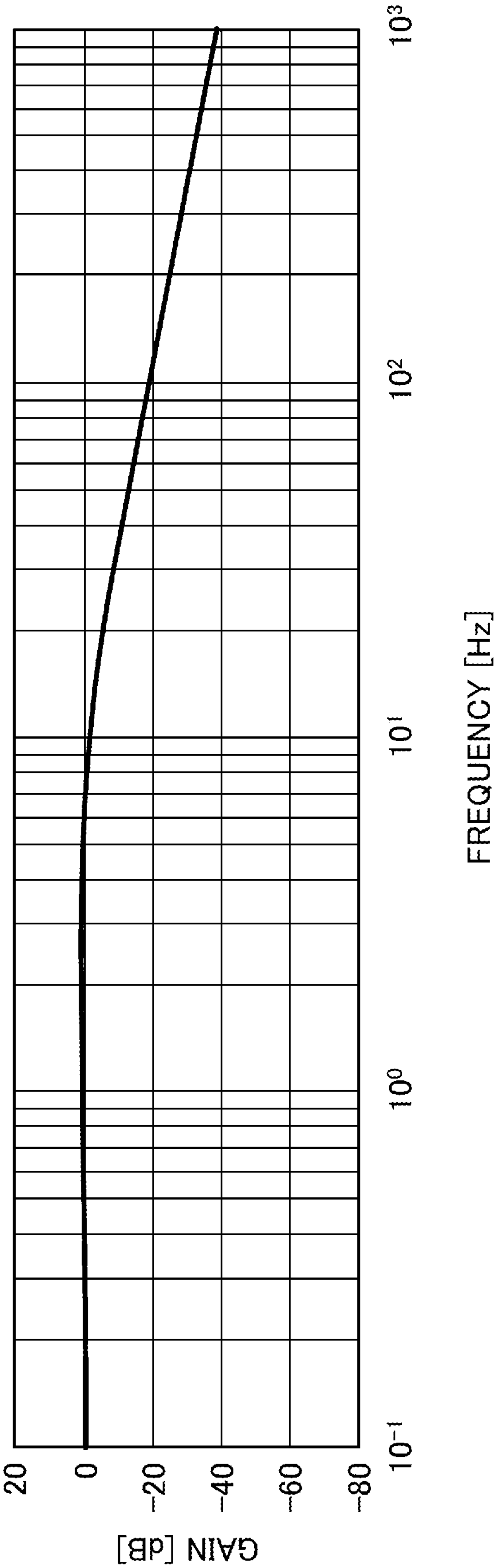
FIG. 2 is a board line graph illustrating the transmission characteristic from the load torque of the compressor to the output torque of the electric motor.

Next, with reference to FIG. 2, an overview of the determination of anomaly of the compressor 10 by the control device 40 is described.

FIG. 2 is a board line graph (gain line graph) illustrating an example of the transmission characteristic from the load torque of the compressor 10 to the output torque of the electric motor 20. Specifically, FIG. 2 is a gain line graph illustrating the transmission characteristic from the load torque to the output torque corresponding to formula (1) described later.

For example, the relationship between the output torque τe and the load torque τL of the electric motor 20 in the dq vector control of the electric motor 20, on the assumption of PI (Proportional-Integral) control, is approximately expressed by the following formula (1):

[Formula 1]

$$\tau_e = \frac{P_n K_p s + P_n K_I}{Js^2 + P_n K_p s + P_n K_I} \tau_L \tag{1}$$

The notation of J in formula (1) represents the inertia of the rotating part of the compressor 10. Further, the notation of Pn in formula (1) represents the polar logarithm, which is a constant number unique to the electric motor 20. Further, the notations of Kp and Ki in formula (1) represent the control constant numbers (the proportional gain and the integral gain, respectively) in PI control, for controlling the deviation between the driving frequency command of the electric motor 20 and the present driving frequency.

Further, for example, the relationship between the output torque τe of the electric motor 20 and the current (d axis current id and q axis current iq) in the dq vector control of the electric motor 20 is expressed by the following formula (2):

[Formula 2]

$$\tau_e = P_n\{\Lambda_a i_q + (L_d - L_q) i_d i_q\} \tag{2}$$

In formula (2), Λa represents the magnetic flux, which is a constant number unique to the electric motor 20. Further, Ld and Lq in formula (2) represent the d axis inductance and the q axis inductance, respectively, which are constant numbers unique to the electric motor 20.

For example, if an anomaly occurs in a mechanical element of the compressor 10, the load torque τL may change relative to the normal state. Therefore, as indicated in formula (1), the control device 40 changes the output torque τe of the electric motor 20 in response to the change in the load torque τL corresponding to the anomaly of the compressor 10. In this case, as indicated in formula (2), the current of the electric motor 20 changes from the range corresponding to the normal state due to the change in the output torque τe corresponding to the anomaly occurring in the compressor 10. Therefore, the control device 40 can use the electrical feature amount of the compressor 10 (the electric motor 20) to make the determination relating to the anomaly of the mechanical element of the compressor 10.

The control mode of the electric motor 20 is not limited to dq vector control and may be other control modes. For example, primary magnetic flux control (see, e.g., Japanese Patent No. 5494760 publication) may be applied as a control mode of the electric motor 20. Likewise, in this case, the control device 40 can use the electrical feature amount of the compressor 10 (the electric motor 20) to make a determination relating to the anomaly of the mechanical element of the compressor 10.

On the other hand, as illustrated in FIG. 2, the gain of the transmission characteristic from the load torque to the output torque varies depending on the frequency. In particular, in this example, due to the influence of inertia J considered in formula (1), the gain is relatively small in the range where the frequency is relatively large (a range exceeding approximately 10 Hz). On the other hand, the electrical feature amount described later is a particular frequency component of a signal that correlates with the current of the electric motor 20, and the particular frequency component is a predetermined positive integral multiple component of the rotational frequency of the compressor 10 (the electric motor 20). Therefore, in the range where the rotational frequency of the compressor 10 is relatively large, that is, in the range where the particular frequency component becomes relatively large, the gain becomes relatively small, and the magnitude of the change in the load torque caused by the anomaly appears relatively small in the electrical feature amount. As a result, the rotational frequency of the compressor 10 may cause variations in how anomalies in mechanical elements of the compressor 10 appear as an electrical feature of the compressor 10 (the electric motor 20). Therefore, for example, if the same reference is used to make a determination relating to the anomaly based on the electrical feature amount, regardless of the rotational frequency of the compressor 10, the accuracy of the determination relating to the anomaly may decrease.

On the other hand, in the present embodiment, the control device 40 makes a determination relating to the anomaly of the compressor 10 by considering the variation of the relationship between the anomaly of the mechanical element of the compressor 10 and the electrical feature amount of the compressor 10 caused by the change in the rotational frequency. Specific methods for determining anomalies are described in detail below.

[First Example of Determination of Anomaly of Compressor]

Next, with reference to FIG. 3, a first example of anomaly determination of a mechanical element of the compressor 10 by the control device 40 will be described.

In this example, the control device 40 makes an anomaly determination relating to bearing wear of the compressor 10.

Figure 3:
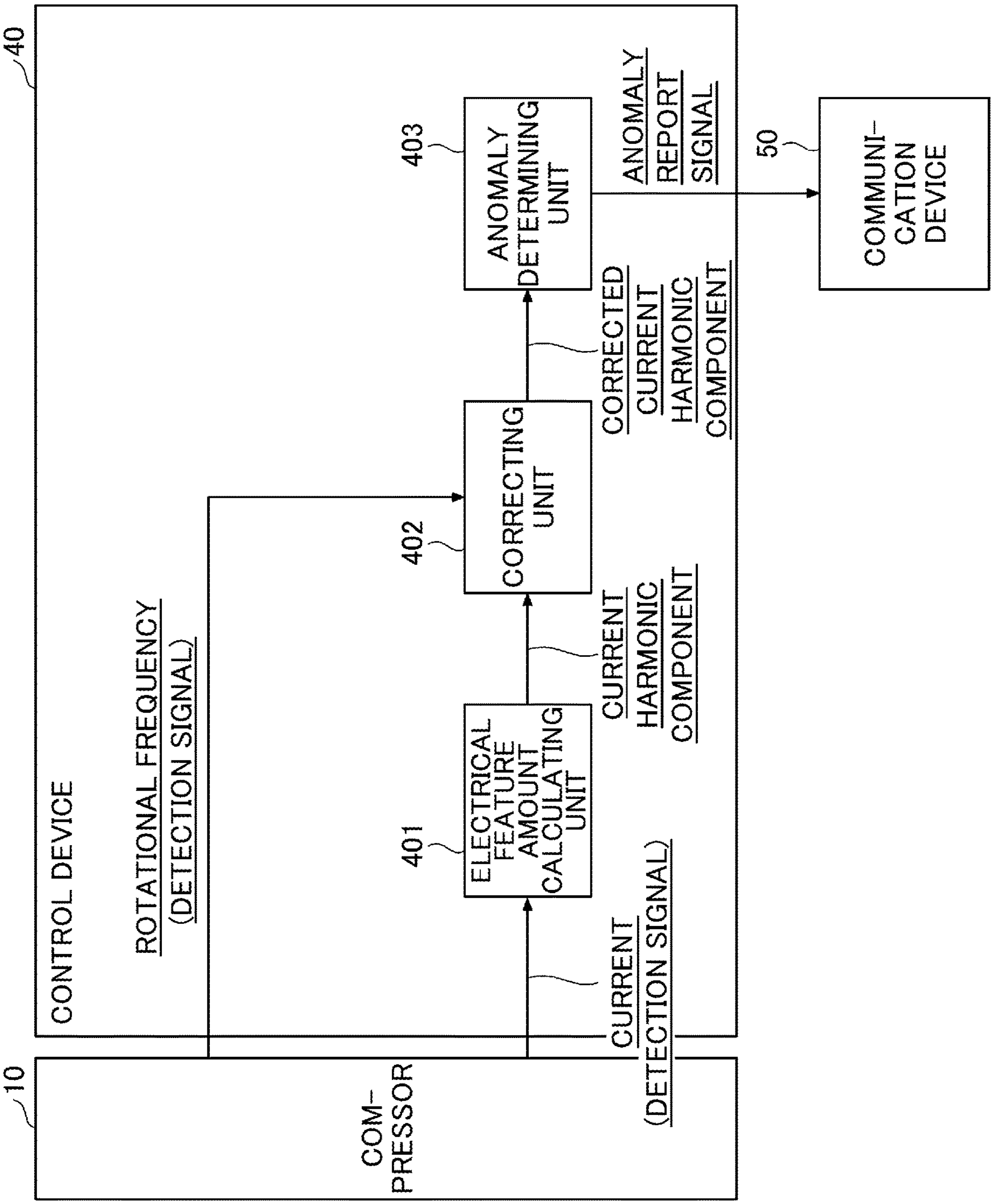
FIG. 3 is a functional block diagram illustrating the first example of a functional configuration relating to the anomaly determination of a mechanical element in a compressor.

FIG. 3 is a functional block diagram illustrating a first example of the functional configuration relating to the determination of an anomaly of a mechanical element of the compressor 10.

As illustrated in FIG. 3, the control device 40 includes an electrical feature amount calculating unit 401, a correcting unit 402, and an anomaly determining unit 403.

Based on a detection signal representing the electric operation state of the electric motor 20 taken in from the compressor 10, the electrical feature amount calculating unit 401 calculates an electrical feature amount used to determine the anomaly of the compressor 10. The detection signal on which the calculation of the electrical feature amount is based is, for example, a detection signal relating to the current, the voltage, the power, etc.

An electrical feature amount is a particular frequency component (for example, a harmonic component) of a signal that represents a physical amount correlated with the electric current of the electric motor 20. The harmonic component of the signal representing the physical amount correlated with the current of the electric motor 20 means the component of the positive integral multiple of the rotational frequency of the electric motor 20 in the signal representing the physical amount correlated with the current of the electric motor 20. By using a detection signal representing the electric operation state of the electric motor 20 taken in from the compressor 10, the electrical feature amount calculating unit 401 calculates a signal correlated with the current of the electric motor 20 and calculates the frequency component of the signal.

For example, the electrical feature amount may be a signal representing a physical amount correlated with the amplitude of the current of the electric motor 20, i.e., a particular frequency component of a DC signal correlated with the current of the electric motor 20. Further, for example, the electrical feature amount may be a signal representing a physical amount that alternates in correlation with the current of the electric motor 20, that is, a frequency component that deviates by a particular frequency from the fundamental frequency of the electric motor 20 in an AC signal that correlates with the current of the electric motor 20.

The AC signal that correlates with the current of the electric motor 20 is, for example, the phase current or the phase voltage or the line current or the inter-line voltage of the electric motor 20. The AC signal correlated with the current of the electric motor 20 may be, for example, a two phase AC current (for example, an a axis current and a β axis current) or a two phase AC voltage obtained by three phase-two phase conversion of a phase current or a phase voltage or a line current or an inter-line voltage. Further, the AC current correlated with the current of the electric motor 20 may be, for example, the current flowing between the commercial power supply system and the rectifier circuit unit of the electric motor driving device 30.

The DC signal that correlates with the current of the electric motor 20 is, for example, the current vector amplitude (the magnitude of the current vector) or the voltage vector amplitude of the electric motor 20. Further, the DC signal relating to the current of the electric motor 20 may be, for example, the square value of the current vector amplitude or the voltage vector amplitude of the electric motor 20. Further, the DC signal relating to the current of the electric motor 20 may be the phase current amplitude, the phase current effective value, the phase voltage amplitude, the phase voltage effective value, the instantaneous power, the instantaneous imaginary power, the apparent power, the active power, or reactive power of the electric motor 20.

The magnitude of the current vector of the electric motor 20 is expressed as the square root of the sum of the squares of the respective three phase currents of the electric motor 20.

The phase current amplitude I of the electric motor 20 is expressed by the following formula (3) by using the phase current $i_u$ and the phase $\omega_i t$ of the phase current.

[Formula 3]

$$I = \frac{i_u}{\cos \omega_i t} \tag{3}$$

The phase current effective value $I_{rms}$ of the electric motor 20 is expressed by the following formula (4) by using the phase current amplitude I.

[Formula 4]

$$I_{rms} = \frac{I}{\sqrt{2}} \tag{4}$$

The instantaneous power of the electric motor 20 is expressed by the following formula (5) by using the three phase currents $i_u$, $i_v$, $i_w$ and the three phase voltages $v_u$, $v_v$, $v_w$, the two phase currents and the two phase voltages (α axis current $i_\alpha$, β axis current $i_\beta$, α axis voltage $v_\alpha$, and β axis voltage $v_\beta$ or d axis current $i_d$, q axis current $i_q$, d axis voltage $v_d$, and q axis voltage $v_q$) of the two phases.

[Formula 5]

$$p=v_u i_u+v_v i_v+v_w i_w=v_\alpha i_\alpha+v_\beta i_\beta=v_d i_d+v_q i_q \tag{5}$$

The instantaneous imaginary power q is expressed by the following formula (6) by using the α axis current $i_\alpha$, the β axis current $i_\beta$, the α axis voltage $v_\alpha$, and the β axis voltage $v_\beta$.

[Formula 6]

$$q=v_\alpha i_\beta-v_\beta i_\alpha \tag{8}$$

The apparent power S is expressed by the following formula (7) by using the phase current effective value $I_{rms}$ and the phase voltage effective value $V_{rms}$.

[Formula 7]

$$S=3V_{rms}I_{rms} \tag{7}$$

The effective power P is expressed by the following formula (8) by using the phase current effective value $I_{rms}$, the phase voltage effective value $V_{rms}$, and the phase difference $\Phi_1$ between the phase current and the phase voltage.

[Formula 8]

$$P=3V_{rms}I_{rms}\cos\varphi_1 \tag{8}$$

The reactive power Q is expressed by the following formula (9) by using the phase current effective value $I_{rms}$, the phase voltage effective value $V_{rms}$, and the phase difference $\Phi_1$ between the phase current and the phase voltage.

[Formula 9]

$$Q=-3V_{rms}I_{rms}\sin\varphi_1 \tag{9}$$

The DC signal correlated with the current of the electric motor 20 may be, for example, a DC signal obtained by converting the phase current, the phase voltage, the line current, and the inter-line voltage of the electric motor 20 by a three phase-two phase conversion, and further performing rotational coordinate conversion. This DC signal is, for example, a d axis current and a q axis current obtained by performing rotational coordinate conversion on the α axis current and the β axis current obtained by converting a phase current of the electric motor 20 by a three phase-two phase conversion, by an angle based on the orientation of the magnetic pole of the rotor of the electric motor 20. Further, this DC signal is, for example, M axis current and a T axis current obtained by performing rotational coordinate conversion on the α axis current and β axis current by an angle based on the orientation of the primary magnetic flux of the rotor of the electric motor 20. Further, this DC signal may be the current $i_\gamma$, $i_\delta$ obtained by performing rotational coordinate conversion on the three phase currents $i_u$, $i_v$, $i_w$ by the phase $\omega_i t$ of the phase current or the phase voltage by using the following formula (10).

[Formula 10]

$$\begin{bmatrix} i_\gamma \\ i_\delta \end{bmatrix} = k \begin{bmatrix} \cos\omega_i t & \cos\left(\omega_i t - \frac{2}{3}\pi\right) & \cos\left(\omega_i t - \frac{4}{3}\pi\right) \\ -\sin\omega_i t & -\sin\left(\omega_i t - \frac{2}{3}\pi\right) & -\sin\left(\omega_i t - \frac{4}{3}\pi\right) \end{bmatrix} \begin{bmatrix} i_u \\ i_v \\ i_w \end{bmatrix} \quad (10)$$

Further, the DC signals correlated with the electric current of the electric motor 20 are the electric power input to the rectifier circuit unit of the electric motor driving device 30, the electric power output from the rectifier circuit unit, the electric power output from the smoothing circuit unit, the electric current flowing between the rectifier circuit unit and the smoothing circuit unit, the electric current flowing between the smoothing circuit unit and the inverter circuit unit, etc.

For example, the electrical feature amount calculating unit 401 may calculate a signal that correlates with the current based on the three phase currents (detected values) of the electric motor 20. For example, the current vector amplitude (the magnitude of the current vector) is calculated as a signal that correlates with the current. In this case, the three phase currents of the electric motor 20 may be detected by a current sensor that detects each of at least two phase currents among the three phase currents of the electric motor 20, as described above. Further, as described above, the three phase currents of the electric motor 20 may be calculated based on the output of a single current detecting unit that detects the current of a DC link, such as a shunt resistance, and the switching pattern of the inverter circuit unit. In particular, in the latter case, only the output of a single current detector can be used to obtain the three phase currents of the electric motor 20. Therefore, when the outputs of multiple current sensors are used with respect to a signal that is calculated based on current values of two or more phases, such as a current vector amplitude, for example, it is possible to prevent a situation in which a frequency component that does not actually exist appears in the current vector amplitude that is finally calculated, caused by the influence of individual differences in each current sensor. As a result, by obtaining (calculating) the electrical feature amount by using only the output of a single current detector, the control device 40 can avoid making an erroneous determination relating to the anomaly of the mechanical element of the compressor 10 and make a more appropriate determination relating to the anomaly of the mechanical element of the compressor 10.

In this example, the electrical feature amount may be a second-order harmonic component or a higher harmonic component (for example, at least one of a second-order harmonic component or a third-order harmonic component) of a signal that represents a physical amount correlated with the current of the electric motor 20. A second-order harmonic component and a third-order harmonic component mean a frequency component two times and three times the rotational frequency of the electric motor 20, respectively. This is because as bearing wear progresses, the corresponding harmonic component may become larger relative to that of the normal state (that is, when the bearing wear has not relatively progressed).

Hereafter, the explanation is focused on the case where the electrical feature amount is a particular frequency component (harmonic component) of a signal of the size of the current vector of the electric motor 20.

In this example, the electrical feature amount calculating unit 401 calculates the harmonic component (hereafter, "current harmonic component" as a matter of convenience) of the magnitude of the current vector of the electric motor 20 based on the detection signal relating to the current of the electric motor 20 taken in from the compressor 10. Specifically, the electrical feature amount calculating unit 401 calculates the second-order harmonic component and the third-order harmonic component as described above. This is because, as described above, as the bearing wear progresses, a second-order harmonic component or a higher harmonic component may change in size (to be specific, grows larger) compared to that of the normal state (when the bearing wear has not relatively progressed). Here, the magnitude of the current vector is the square root of the sum of the square values of the three phase currents of the electric motor 20. The second-order of the magnitude of the current vector represents a frequency component that is two times the rotational frequency among the frequency components of the magnitude of the current vector, and the third-order of the magnitude of the current vector represents a frequency component that is three times the rotational frequency.

Note that the electrical feature amount calculating unit 401 may calculate only one of the second-order and third-order harmonic components (for example, the second-order current harmonic component and the third-order current harmonic component) of the signal representing the physical amount correlated with the current of the electric motor 20. Further, the electrical feature amount calculating unit 401 may calculate the second-order harmonic component, the third-order harmonic component, and the first-order harmonic component (for example, the first-order current harmonic component) of the signal representing the physical amount correlated with the current of the electric motor 20, or may calculate the fourth-order harmonic component or a higher harmonic component (for example, the fourth-order current harmonic component or a higher current harmonic component).

Based on the detection signal relating to the rotational frequency of the electric motor 20 taken in from the compressor 10, the correcting unit 402 corrects the deviation of the relationship between the electrical feature amount and the anomaly that is the determination target, with respect to a predetermined reference state, caused by the change in the rotational frequency of the compressor 10. Further, the correcting unit 402 may correct the deviation of the relationship between the electrical feature amount and the anomaly that is the determination target, with respect to a predetermined reference state, caused by the change in the rotational frequency of the compressor 10, based on a control command value, an estimated value, etc., relating to the rotational frequency of the electric motor 20 generated in the control device 40.

In this example, the correcting unit 402 calculates the gain at the frequency ω corresponding to the second-order and third-order harmonic components calculated by the electrical feature amount calculating unit 401 based on the transmission characteristic from the load torque of the compressor 10 to the electric signal (current) of the electric motor 20. The correcting unit 402 then divides the second-order and third-order harmonic components calculated by the electrical feature amount calculating unit 401, by the calculated gain, to correct the second-order and third-order harmonic components used for the anomaly determination. The frequency a corresponding to the second-order and third-order harmonic components calculated by the electrical feature amount calculating unit 401 are frequencies that are two times and three times the rotational frequency of the compressor 10, respectively, when the detection signal of the current used for the calculation of the second-order and third-order harmonic components is acquired. The transmission characteristic from the load torque of the compressor 10 to the electrical signal of the electric motor 20 corresponds to the transmission characteristic until the anomaly of the mechanical element of the compressor 10 appears in the electrical feature amount. Hereafter, the current harmonic component divided by the gain and corrected to the load torque dimension is sometimes referred to as "corrected current harmonic component". Accordingly, the corrected current harmonic component (dimension of load torque), in which the electrical feature amount (current harmonic component) is corrected in a way that prevents the difference (variation) in the occurrence of the anomaly caused by the change in the rotational frequency of the compressor 10, can be used for the anomaly determination.

Specifically, based on a transmission function H (s) representing the transmission characteristic from the load torque of the compressor 10 to the electric signal of the electric motor 20, the correcting unit 402 calculates the gain H (ω) of the frequency ω corresponding to the current harmonic component calculated by the electrical feature amount calculating unit 401. Then, the correcting unit 402 may calculate the corrected current harmonic component by dividing the current harmonic component calculated by the electrical feature amount calculating unit 401, by the gain H (ω). In this case, the correcting unit 402 corrects the deviation of the relationship between the electrical feature amount and the anomaly that is the determination target, with respect to the reference state, caused by the change in the rotational frequency of the compressor 10, with the reference state being the time when the gain is one. Further, the correcting unit 402 may calculate the corrected current harmonic component by dividing the current harmonic component calculated by the electrical feature amount calculating unit 401 by the gain H (ω)/H ($\omega_a$) based on the time of a particular frequency $\omega_s$ as a reference. In this case, the correcting unit 402 corrects the deviation of the relationship between the electrical feature amount and the anomaly that is the determination target with respect to the reference state, caused by the change in the rotational frequency of the compressor 10, with the reference state being the time when the frequency is $\omega_s$. In the case of the second example described below, either of these correction methods may be similarly adopted.

The transmission function H (s) may be defined in advance based on a calculation by a theoretical formula, for example, as in formulas (1) and (2) above. In this case, the theoretical formula may include a physical quantity (a constant number) representing the mechanical characteristic of the mechanical element of the compressor 10, such as inertia J in formula (1). This allows the control device 40 to consider the mechanical characteristic of the mechanical element of the compressor 10 as a factor of the variation of the relationship between the anomaly of the mechanical element of the compressor 10 and the electrical feature amount (current harmonic component) caused by the change in the rotational frequency of the compressor 10. Further, for example, instead of or in addition to inertia J of the rotating part, the mechanical characteristic of the mechanical element of the compressor 10, such as the damper (for example, viscous resistance, etc.) corresponding to the force acting against the rotating part in the opposite direction of rotation and the torsional rigidity of the rotating part, etc., may be considered.

Further, the transmission function H (s) may be defined in advance as an approximate expression based on, for example, the measured results of the load torque and electrical signal of the compressor 10. In this case, in the measurement results, the mechanical characteristic of the mechanical element of the compressor 10 will be automatically applied. This allows the control device 40 to consider the mechanical characteristic of the mechanical element of the compressor 10 as a factor in the variation of the relationship between the anomaly of the mechanical element of the compressor 10 and the electrical feature amount (current harmonic component) caused by the change in the rotational frequency of the compressor 10.

Further, the transmission function H (s) may be defined in advance by using both the calculation by the theoretical formula and the measurement results of the electrical signal of the compressor 10.

Hereafter, the content of the transmission function H (s) and the defining method may be the same in the case of the second and third examples described later.

The anomaly determining unit 403 (an example of a determining unit) determines an anomaly of a mechanical element of the compressor 10.

In this example, the anomaly determining unit 403 makes an anomaly determination relating to bearing wear based on the corrected electrical feature amount output from the correcting unit 402.

Based on the corrected electrical feature amounts corresponding to the second-order and third-order harmonic components output from the correcting unit 402, for example, the anomaly determining unit 403 may determine whether the bearing wear has progressed to a degree that can be determined as an anomaly, that is, whether the bearing wear corresponds to an anomaly state. Whether the bearing wear corresponds to an anomaly state may be determined by, for example, whether the corrected electrical feature amount output by the correcting unit 402 is greater than or equal to a lower limit value, by using the limit value (lower limit value) of the corrected electrical feature amount corresponding to each of the second-order and third-order harmonic components, which can be determined as an anomaly state of bearing wear. The limit value (lower limit value) of the corrected electrical feature amount that can be determined as an anomaly state of bearing wear may be defined in advance, for example, through experiments (measurements), simulations, etc.

Further, the anomaly determining unit 403 may transmit a signal (hereinafter, "anomaly report signal") reporting information relating to the anomaly of the compressor 10 to a predetermined external device, for example, through the communication device 50.

The external device at the transmission destination may be, for example, a management apparatus that manages (monitors) the operation state of the air conditioner including the compressor 10, and when the management apparatus receives an anomaly report signal, the management apparatus may, for example, report the content of the anomaly report signal to the user or the service representative of the corresponding air conditioner. The management apparatus may, for example, transmit the report content to the e-mail address or to a Social Networking Service (SNS) account of the user or the service representative. The management apparatus may also transmit a push report to, for example, a user terminal (for example, mobile devices such as smartphones and tablets) owned by a service representative. The management apparatus may be a server device (cloud server) installed in a management center or the like. Further, the management apparatus may be, for example, an edge server provided relatively close to the air conditioner including the compressor 10 (for example, on the premises of facilities with air conditioners and communication facilities such as nearby base stations and station buildings). Further, the management apparatus may be a user terminal owned by the user or the service representative, etc., of the air conditioner including the compressor 10. The user terminal may be, for example, a mobile terminal such as a smartphone or a tablet terminal or a stationary terminal device such as a desktop computer terminal and the like.

Thus, in this example, the anomaly determining unit 403 makes an anomaly determination relating to bearing wear of the compressor 10 based on a second-order current harmonic component or a higher current harmonic component (calculated value) of the compressor 10. Specifically, by using the corrected current harmonic component (dimension of load torque), the anomaly determining unit 403 makes an anomaly determination in consideration of the variation in the relationship between the bearing wear of the compressor 10 and the current harmonic component of the second-order or higher of the compressor 10 caused by the change in the rotational frequency of the compressor 10.

Thus, the control device 40 can improve the accuracy of anomaly determination relating to bearing wear of the compressor 10.

[Second Example of Determination of Anomaly of Compressor]

Next, with reference to FIG. 4, a second example of anomaly determination of a mechanical element of the compressor 10 by the control device 40 will be described.

In this example, the control device 40 makes an anomaly determination relating to the stress (decreased oil sealability, liquid compression, etc.) of the compressor 10.

Figure 4:
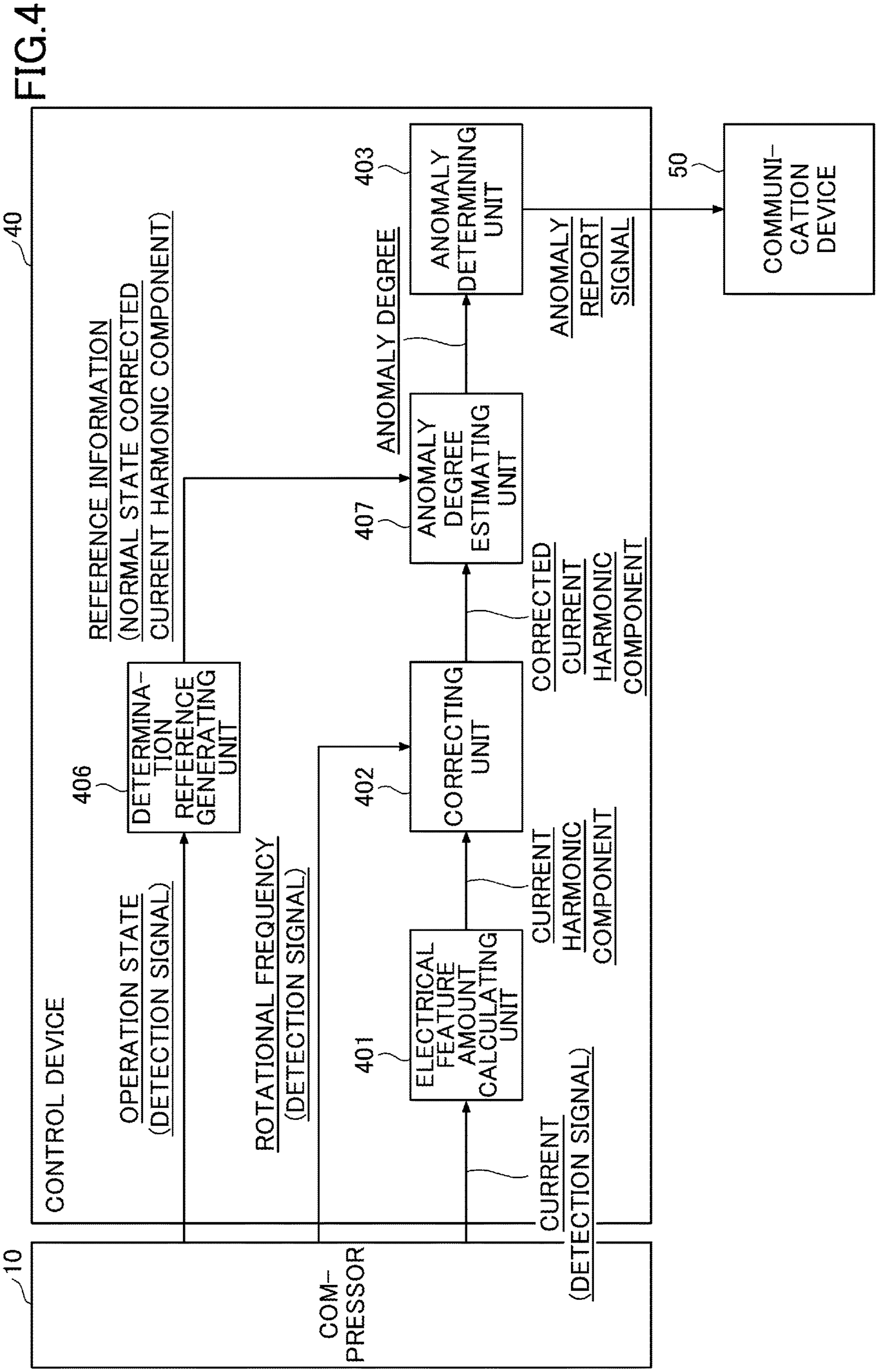
FIG. 4 is a functional block diagram illustrating a second example of a functional configuration relating to the anomaly determination of a mechanical element in a compressor.

FIG. 4 is a functional block diagram illustrating a second example of the functional configuration relating to the determination of an anomaly of a mechanical element of the compressor 10.

As illustrated in FIG. 4, the control device 40 includes the electrical feature amount calculating unit 401, the correcting unit 402, the anomaly determining unit 403, a determination reference generating unit 406, and an anomaly degree estimating unit 407.

In this example, the electrical feature amount calculating unit 401 calculates the first-order harmonic component of a signal representing a physical amount correlated with the current of the electric motor 20. This is because when the oil sealability of the compression chamber decreases, the first-order harmonic component may change relative to that of the normal state (when the oil sealability of the compression chamber is sufficient) caused by the lack of airtightness of the compression chamber and the leakage of refrigerant gas. This is also because the anomaly increases in the compression chamber when liquid compression occurs, and the first-order current harmonic component may change relative to that of the normal state (when liquid compression does not occur).

Specifically, as in the case of the first example described above, the electrical feature amount calculating unit 401 calculates the current harmonic component based on the detection signal relating to the current of the electric motor 20 taken in from the compressor 10. More specifically, the electrical feature amount calculating unit 401 calculates the first-order current harmonic component. This is because when the oil sealability of the compression chamber decreases, the first-order current harmonic component may become relatively small compared to that of the normal state (when the oil sealability of the compression chamber is sufficient) caused by the lack of airtightness of the compression chamber and the leakage of refrigerant gas. This is also because the anomaly in the compression chamber increases when liquid compression occurs, and the first-order current harmonic component may become relatively large compared to that of the normal state (when liquid compression does not occur).

In this example, the correcting unit 402 corrects the electrical feature amount (first-order current harmonic component) calculated by the electrical feature amount calculating unit 401 and calculates the corrected current harmonic component corresponding to the first-order current harmonic component, as in the case of the first example described above.

The determination reference generating unit 406 generates a determination reference relating to anomaly determination and outputs reference information representing the determination reference.

In this example, the determination reference generating unit 406 estimates a first-order harmonic component (hereafter, "normal state corrected current harmonic component") of the dimension of load torque in a normal state based on the detection signal relating to the operation state (for example, temperature, pressure, etc.) of the compressor 10 in a normal state. For example, in an internal memory such as an auxiliary storage device of the control device 40, the relationship between reference information corresponding to the normal state corrected current harmonic component and the detection signal relating to the operation state (For example, temperature, pressure, etc.) of the compressor 10 is stored in advance as a formula or a map. Thus, the determination reference generating unit 406 can estimate the normal state corrected current harmonic component based on this formula or map and the detection signal relating to the operation state of the compressor 10.

The detection signal relating to the operation state of the compressor 10 includes only one of, for example, the detection signal relating to the pressure state on the high pressure side of the compressor 10 and the detection signal relating to the pressure state on the low pressure side of the compressor 10. The detection signal relating to the pressure state of the compressor is, for example, a pressure or temperature detection signal. Further, the detection signal relating to the operation state of the compressor 10 may include, for example, both the detection signal relating to the pressure state on the high pressure side of the compressor 10 and the detection signal relating to the pressure state on the low pressure side of the compressor 10. In this case, for example, in an internal memory such as an auxiliary storage device of the control device 40, the relationship between reference information corresponding to the normal state corrected current harmonic component and the detection signal relating to the pressure state on the low pressure side of the compressor 10 and the detection signal relating to the pressure state on the high pressure side of the compressor 10 is stored as a formula, a map, etc. This allows the control device 40 to generate reference information (normal state corrected current harmonic component) considering the pressure states on both the high and low pressure sides of the compressor 10. Therefore, the control device 40 can improve the accuracy of the determination relating to the anomaly of the compressor 10.

The determination reference generating unit 406 may estimate, for example, the normal state corrected current harmonic component by using as a reference the case where the gain of the transmission function H (s) is one, that is, the normal state corrected current harmonic component by using as a reference the case of being in the frequency (band) of when the gain of the transmission function H (s) is one. Further, the determination reference generating unit 406 may estimate the normal state corrected current harmonic component by using as a reference the case of the particular frequency $\omega_s$, for example. Further, for example, the estimated normal state corrected current harmonic component may be defined as a range having some width.

Formulas, maps, etc., representing the relationship between the reference information corresponding to the normal state corrected current harmonic component and the detection signal relating to the operation state of the compressor 10 may be defined in advance, for example, through experiments, simulations, etc. The same can be applied to the third case described below.

Based on the reference information output from the determination reference generating unit 406 and the corrected current harmonic component output from the correcting unit 402, the anomaly degree estimating unit 407 estimates the degree of anomaly relating to the stress of the compressor 10.

The anomaly degree estimating unit 407 may, for example, estimate the anomaly degree based on how much the corrected current harmonic component output from the correcting unit 402 diverges from the normal state corrected current harmonic component as reference information. Specifically, the anomaly degree estimating unit 407 may estimate the anomaly degree based on the difference between the normal state corrected current harmonic component as reference information and the corrected current harmonic component output from the correcting unit 402. Further, the anomaly degree estimating unit 407 may estimate the anomaly degree based on the ratio between the normal state corrected current harmonic component as reference information and the corrected current harmonic component output from the correcting unit 402.

Further, the anomaly degree estimating unit 407 determines the content of stress corresponding to the anomaly degree, for example, based on whether the corrected current harmonic component output from the correcting unit 402 diverges in a larger direction or in a smaller direction with respect to the normal state corrected current harmonic component as reference information. Specifically, if the corrected current harmonic component output from the correcting unit 402 diverges from the normal state corrected current harmonic component in a larger direction from the normal state corrected current harmonic component, the anomaly degree estimating unit 407 may estimate the anomaly degree relating to liquid compression, and if the corrected current harmonic component output from the correcting unit 402 diverges in a smaller direction, the anomaly degree estimating unit 407 may estimate the anomaly degree relating to the decrease in oil sealability.

In this example, the anomaly determining unit 403 makes an anomaly determination relating to the stress of the compressor 10 based on the estimation result (anomaly degree) of the anomaly degree estimating unit 407.

For example, when the anomaly degree estimated by the anomaly degree estimating unit 407 is greater than or equal to a predetermined threshold, the anomaly determining unit 403 may determine that the stress of the compressor 10 corresponds to an anomaly state (for example, a state immediately before a failure).

In this example, the anomaly determining unit 403 transmits an anomaly report signal corresponding to the result of the anomaly determination relating to the stress of the compressor 10 to an external device through the communication device 50.

When it is determined, for example, that the stress of the compressor 10 corresponds to an anomaly state, the anomaly determining unit 403 transmits an anomaly report signal indicating this message to an external device through the communication device 50. The same can be applied to the third case described below.

Thus, in this example, the anomaly determining unit 403 makes an anomaly determination relating to the stress (decreased oil sealability, liquid compression, etc.) of the compressor 10 based on the first-order current harmonic component (calculated value) of the compressor 10. Specifically, by using the corrected current harmonic component (dimension of load torque), the anomaly determining unit 403 makes an anomaly determination in consideration of the variation in the relationship between the anomaly relating to the stress of the compressor 10 and the first-order current harmonic component of the compressor 10 caused by the change in the rotational frequency of the compressor 10.

Accordingly, the control device 40 can improve the accuracy of anomaly determination relating to the stress (decreased oil sealability, liquid compression, etc.) of the compressor 10.

[Third Example of Determination of Anomaly of Compressor]

Next, with reference to FIG. 5, a third example of anomaly determination of a mechanical element of the compressor 10 by the control device 40 will be described.

In this example, as in the case of the second example above, the control device 40 makes an anomaly determination relating to the stress (decreased oil sealability, liquid compression, etc.) of the compressor 10. Hereafter, the explanation will focus on different parts from the second example above, and the same content as the second example above may be omitted.

Figure 5:
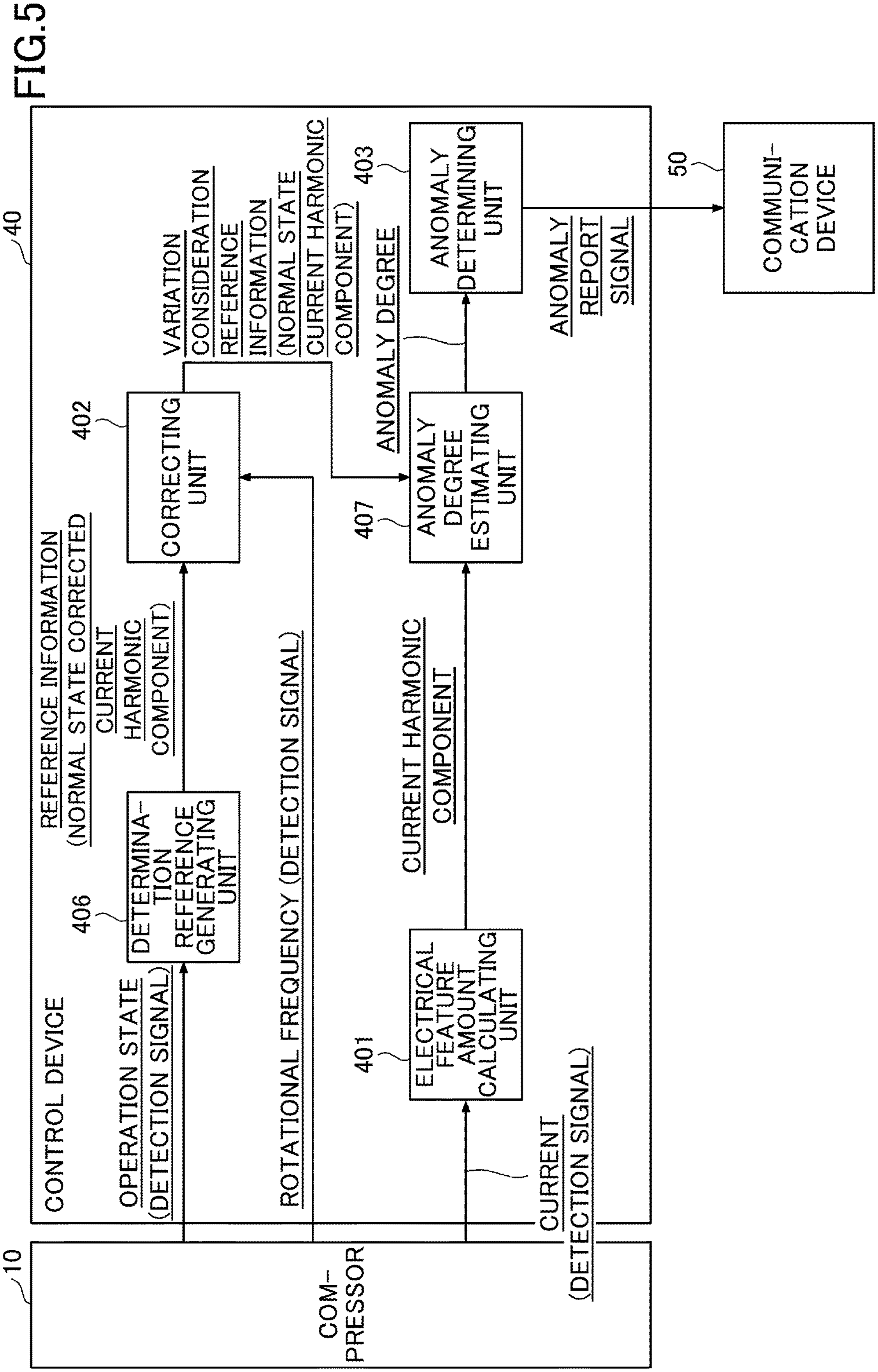
FIG. 5 is a functional block diagram illustrating a third example of a functional configuration relating to the anomaly determination of a mechanical element in a compressor.

FIG. 5 is a functional block diagram illustrating a third example of the functional configuration for determining the anomaly of a mechanical element of the compressor 10.

As illustrated in FIG. 5, the control device 40 includes the electrical feature amount calculating unit 401, the correcting unit 402, the anomaly determining unit 403, the determination reference generating unit 406, and the anomaly degree estimating unit 407.

In this example, unlike the case of the second example described above, the correcting unit 402 corrects the reference information generated by the determination reference generating unit 406 to correct the deviation of the relationship between the electrical feature amount and the anomaly that is the determination target, with respect to a predetermined reference state, caused by the change in the rotational frequency of the compressor 10. The correcting unit 402 outputs the corrected reference information (hereinafter, "variation consideration reference information"), in which the variation in the relationship between the electrical feature amount and the anomaly that is the determination target caused by the change in the rotational frequency of the compressor 10 is considered.

The correcting unit 402 calculates, for example, a gain at a frequency ω corresponding to the first-order current harmonic component calculated by the electrical feature amount calculating unit 401 based on the transmission characteristic from the load torque of the compressor 10 to the electric signal (current) of the electric motor 20. Then, the correcting unit 402 corrects the normal state corrected current harmonic component used for anomaly determination by multiplying the calculated gain by the normal state corrected current harmonic component generated by the determination reference generating unit 406. Hereafter, the normal state corrected current harmonic component that is multiplied by the gain and that is corrected to the current dimension, may be referred to as "normal state current harmonic component". Accordingly, it is possible to use, for anomaly determination, the normal state current harmonic component (dimension of current) in which the reference information (normal state corrected current harmonic component) is corrected so as to reduce the difference (variation) in how the anomaly appears caused by the change in the rotational frequency of the compressor 10.

Specifically, the correcting unit 402 may calculate the normal state current harmonic component by multiplying the normal state corrected current harmonic component that uses as a reference the case where the gain of the transmission function H (s) is one, by the gain H (ω) of the frequency ω corresponding to the current harmonic component calculated by the electrical feature amount calculating unit 401. Further, the correcting unit 402 may calculate the normal state current harmonic component by multiplying the normal state corrected current harmonic component that uses as a reference the case where a particular frequency is $\omega_s$ by the gain H (ω)/H ($\omega_s$) that uses as a reference the case where a particular frequency $\omega_s$. Accordingly, the correcting unit 402 can correct the normal state corrected current harmonic component (torque dimension) as reference information to the normal state current harmonic component (current dimension) as variation consideration reference information, and can align the normal state corrected current harmonic component with the same current dimension as the current harmonic component. In these cases, the correcting unit 402 corrects the deviation from the reference state of the relationship between the electrical feature amount and the anomaly that is the determination target caused by the change in the rotational frequency of the compressor 10, with the reference state being the case of the frequency ω corresponding to the current harmonic component calculated by the electrical feature amount calculating unit 401.

The anomaly degree estimating unit 407 estimates the degree of anomaly relating to the stress of the compressor 10 based on the variation consideration reference information (normal state current harmonic component) output from the correcting unit 402 and the first-order current harmonic component calculated by the electrical feature amount calculating unit 401.

The anomaly degree estimating unit 407 may, for example, estimate the anomaly degree based on how far the current harmonic component output from the correcting unit 402 diverges from the normal state current harmonic component as variation consideration reference information. Specifically, the anomaly degree estimating unit 407 may estimate the anomaly degree based on the difference between the normal state current harmonic component as the variation consideration reference information and the current harmonic component calculated by the electrical feature amount calculating unit 401. Further, the anomaly degree estimating unit 407 may estimate the anomaly degree based on the ratio between the normal state current harmonic component as variation consideration reference information and the current harmonic component calculated by the electrical feature amount calculating unit 401. Accordingly, the influence of the change in the rotational frequency can be prevented and the accuracy of the anomaly determination can be improved.

Further, the anomaly degree estimating unit 407 determines the content of stress corresponding to the anomaly degree, for example, based on whether the current harmonic component calculated by the electrical feature amount calculating unit 401 diverges in a larger direction or a smaller direction with respect to the normal state current harmonic component as the variation consideration reference information. Specifically, if the current harmonic component calculated by the electrical feature amount calculating unit 401 diverges from the normal state current harmonic component in a larger direction, the anomaly degree estimating unit 407 may estimate the anomaly degree relating to liquid compression, and if the current harmonic component diverges in a smaller direction, the anomaly degree estimating unit 407 may estimate the anomaly degree relating to the decrease in oil sealability.

In this example, as in the case of the second example above, the anomaly determining unit 403 makes an anomaly determination relating to the stress of the compressor 10 based on the estimation result (anomaly degree) of the anomaly degree estimating unit 407.

Thus, in this example, the anomaly determining unit 403 makes an anomaly determination relating to the stress (decreased oil sealability, liquid compression, etc.) of the compressor 10 based on the first-order current harmonic component (calculated value) of the compressor 10. Specifically, by using the variation consideration reference information (normal state current harmonic component) corrected to the current dimension, the anomaly determining unit 403 makes an anomaly determination in consideration of the variation in the relationship between the anomaly relating to the stress of the compressor 10 and the first-order current harmonic component of the compressor 10 caused by the change in the rotational frequency of the compressor 10.

Accordingly, the control device 40 can improve the accuracy of anomaly determination relating to the stress (decreased oil sealability, liquid compression, etc.) of the compressor 10.

[Fourth Example of Determination of Anomaly of Compressor]

Next, with reference to FIG. 6 and FIG. 7, a fourth example of anomaly determination of a mechanical element of the compressor 10 by the control device 40 will be described.

In this example, the control device 40 makes an anomaly determination relating to the stress (decreased oil sealability, liquid compression, etc.) of the compressor 10 as in the cases of the second and third examples above. The following discussion will focus on different parts from the second and third examples above, and the same content as the second and third examples above may be omitted.

Figure 6:
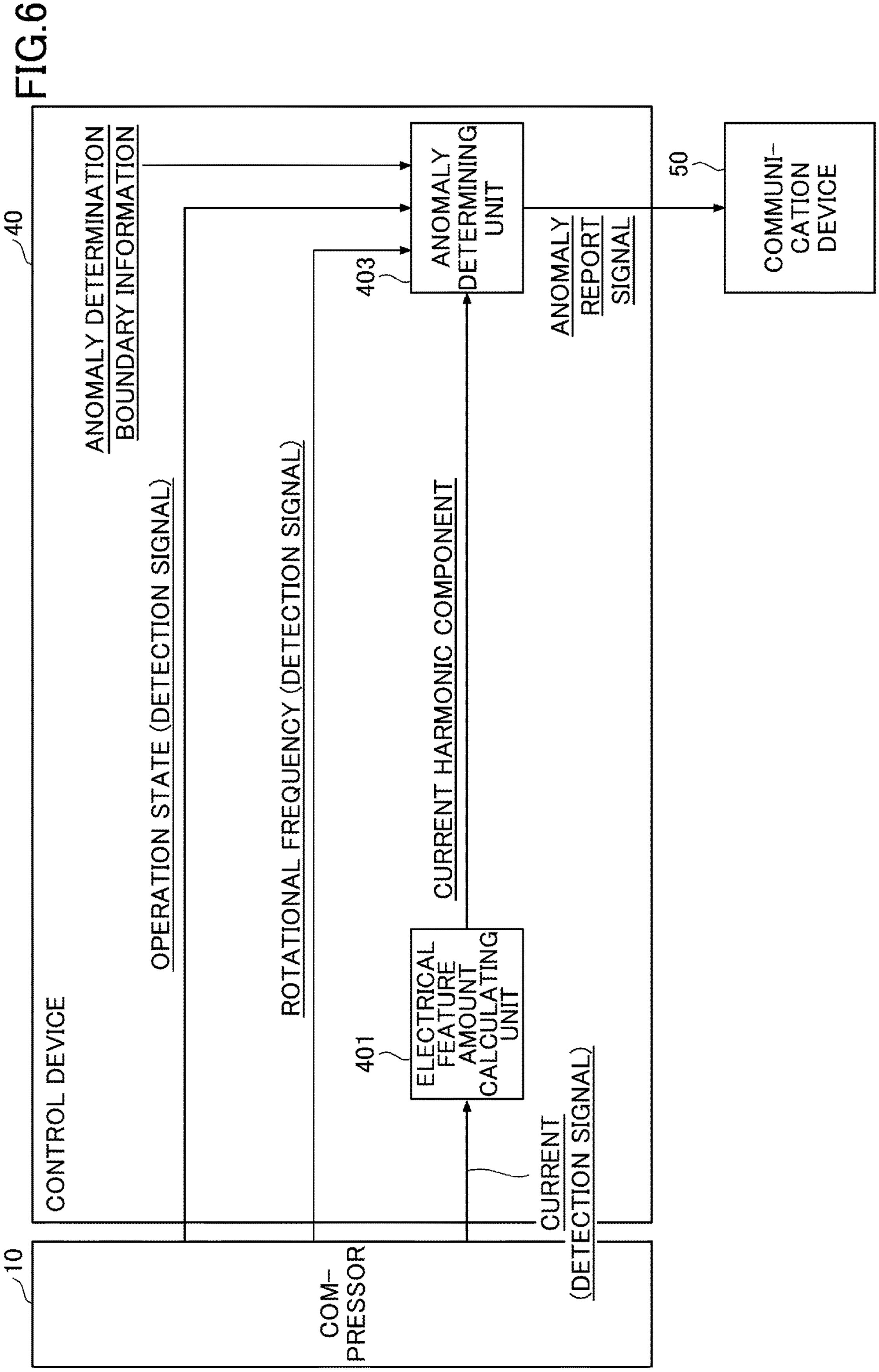
FIG. 6 is a functional block diagram illustrating a fourth example of a functional configuration relating to the anomaly determination of a mechanical element in a compressor.

FIG. 6 is a functional block diagram illustrating a fourth example of the functional configuration relating to the determination of an anomaly of a mechanical element of the compressor 10. FIG. 7 is a diagram for explaining the anomaly determination method in this example.

As illustrated in FIG. 6, the control device 40 includes the electrical feature amount calculating unit 401 and the anomaly determining unit 403.

In this example, the anomaly determining unit 403 makes an anomaly determination relating to the stress of the compressor 10 based on the current harmonic component calculated by the electrical feature amount calculating unit 401 and the detection signal relating to the rotational frequency of the electric motor 20 taken in from the compressor 10. Further, the anomaly determining unit 403 may make an anomaly determination relating to the stress of the compressor 10 based on the current harmonic component calculated by the electrical feature amount calculating unit 401 and the detection signal relating to the rotational frequency of the electric motor 20 and the detection signal relating to the operation state taken in from the compressor 10.

The anomaly determining unit 403 makes an anomaly determination by using, for example, information on a boundary distinguishing between normal and anomaly states on a coordinate system of two variables in which the first-order current harmonic component and the rotational frequency of the compressor 10 are the variables (hereinafter, "anomaly determination boundary information"). Specifically, the anomaly determining unit 403 may perform an anomaly determination according to whether the coordinates defined by the current harmonic component calculated by the electrical feature amount calculating unit 401 and the rotational frequency corresponding to the current harmonic component are on the anomaly side or on the normal side of the boundary defined by the anomaly determination boundary information.

The anomaly determination boundary information is predefined (generated) by, for example, so-called supervised machine learning. Further, machine learning may be performed by the control device 40 to generate anomaly determination boundary information. A machine learning method applied for generating anomaly determination boundary information is, for example, Support Vector Machine (SVM). The method of machine learning applied for generating anomaly determination boundary information may be, for example, the k-neighborhood method or a mixed Gaussian distribution model.

Figure 7:
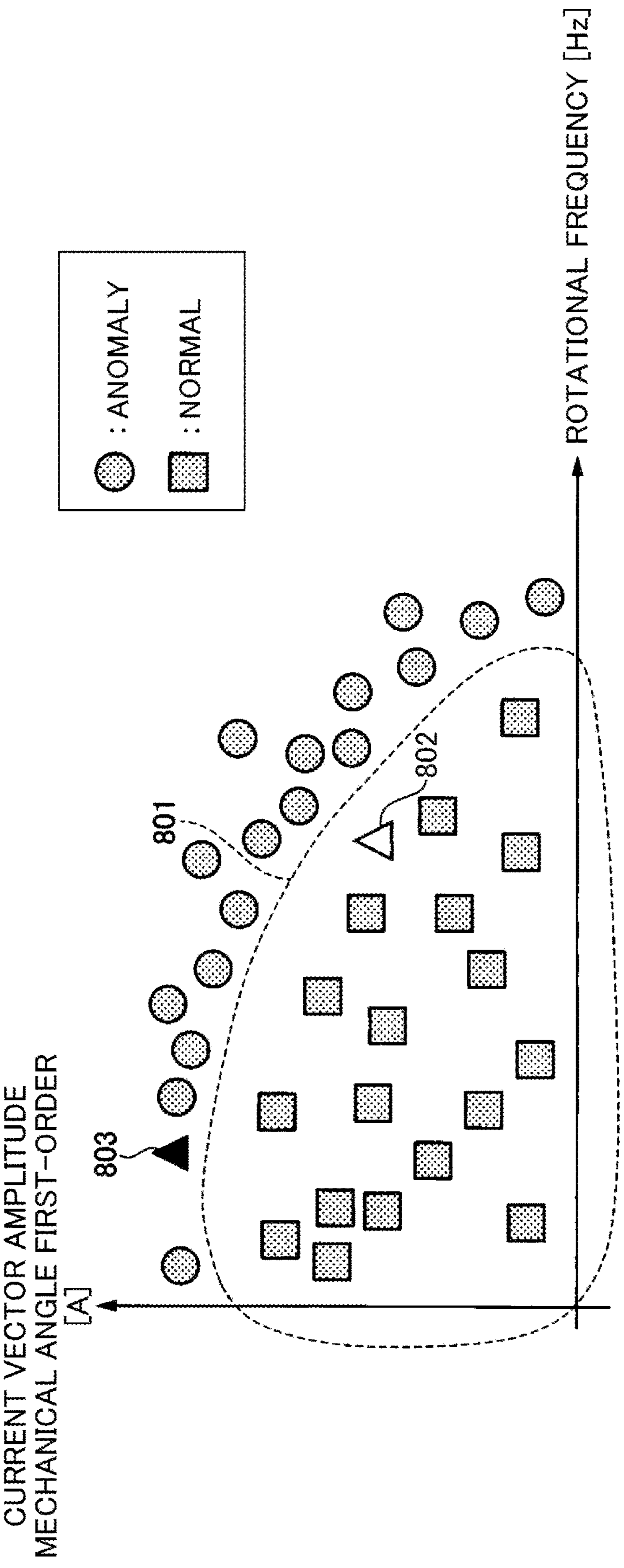
FIG. 7 is a diagram illustrating the anomaly determination method.

For example, as illustrated in FIG. 7, teacher data (square) representing the normal state and teacher data (circle) representing the anomaly state relating to the stress of the compressor 10 are plotted on a coordinate system with the vertical and horizontal axes representing the first-order current harmonic component and the rotational frequency, respectively. Machine learning is performed by using these pieces of teacher data to generate a boundary 801 that divides between normal and anomaly on a two-variable coordinate system in which with the first-order current harmonic component and the rotational frequency of the compressor 10 are variables. The value of the first-order current harmonic component on the boundary 801 varies according to the change in the rotational frequency of the compressor 10. That is, the boundary 801 takes into consideration the variation in the relationship between the anomaly of the mechanical element of the compressor 10 and the electrical feature amount (in this example, the first-order current harmonic component) of the compressor 10 caused by the change in the rotational frequency of the compressor 10.

Thus, by using the anomaly determination boundary information, the anomaly determining unit 403 can determine the anomaly of the compressor 10 in consideration of the variation in the relationship between the anomaly of the mechanical element of the compressor 10 and the electrical feature amount of the compressor 10 caused by the change in the rotational frequency.

For example, even when data 802 (white triangle) and data 803 (black triangle) whose rotation frequencies are different from each other are input, the anomaly determining unit 403 can determine the former case as a normal state and the latter case as an anomaly state by using the boundary 801.

Further, the anomaly determining unit 403 may make an anomaly determination relating to the stress of the compressor 10 on a multi-variable coordinate system in which, for example, in addition to the first-order current harmonic component and the rotational frequency of the compressor 10, parameters relating to other operation states are added (for example, temperature, discharge pressure, suction pressure, etc.). In this case, the anomaly determination boundary information defines a boundary for distinguishing between normal and anomaly on a multi-variable coordinate system in which parameters relating to other operation states are added in addition to the first-order current harmonic component and rotational frequency of the compressor 10. In this case also, the anomaly determination boundary information is generated by applying the machine learning method described above.

Thus, the anomaly determining unit 403 can make a determination relating to the anomaly of the compressor 10 in consideration of the variation in the relationship between the anomaly of the mechanical element of the compressor 10 and the electrical feature amount of the compressor 10 caused by the change in an operation state other than the rotational frequency of the compressor 10.

Thus, in this example, the anomaly determining unit 403 makes an anomaly determination relating to the stress inside the compressor 10 based on the first-order current harmonic component (calculated value) of the compressor 10. Specifically, by using the anomaly determination boundary information, the anomaly determining unit 403 makes an anomaly determination in consideration of the variation in the relationship between the anomaly relating to the stress of the compressor 10 and the first-order current harmonic component of the compressor 10 caused by the change in the rotational frequency of the compressor 10.

Accordingly, the control device 40 can improve the accuracy of anomaly determination relating to the stress (decreased oil sealability, liquid compression, etc.) of the compressor 10.

[Other Examples of Determination of Anomaly of Compressor]

Next, referring to the first to fourth examples above, other examples of anomaly determination of a mechanical element of the compressor 10 by the control device 40 will be described.

The contents of the first to fourth examples above can be combined as appropriate.

For example, in the above first example, the control device 40 (the correcting unit 402) may correct the reference information as in the above third example, instead of correcting the electrical feature amount calculated by the electrical feature amount calculating unit 401. In this case, the reference information in the first example described above corresponds to the threshold value for anomaly determination used in the anomaly determining unit 403.

Further, for example, the control device 40 (the anomaly determining unit 403) may make an anomaly determination relating to bearing wear of the compressor 10 by using a method similar to that in the case of the fourth example above.

The contents of the first to fourth examples above may be changed as appropriate.

For example, if the compressor 10 is a displacement type compressor, the control device 40 (the anomaly determining section 403) may determine that there is an anomaly corresponding to the decrease in oil sealability of the compression chamber of the compressor 10 based on the decrease in the component of the driving frequency of the electric motor 20 in the compression torque of the compressor 10. Thus, the control device 40 can relatively easily identify (detect), for example, a state in which there is no more oil to seal the compression chamber of the compressor 10 and the compression chamber is no longer airtight.

Specifically, the control device 40 may determine a decrease in the component of the driving frequency of the electric motor 20 in the compression torque of the compressor 10, according to the decrease in a particular frequency component of the signal representing a physical amount correlated with the current of the electric motor 20.

The signals representing physical quantities correlated with the current of the electric motor 20 are, for example, DC signals (for example, the magnitude of the current vector of the electric motor 20, etc.) and AC signals (for example, the phase current of the electric motor 20, etc.) correlated with the current of the electric motor 20 as described above. For example, when using the DC signal correlated with the current of the electric motor 20, the control device 40 determines whether there is a decrease in a particular frequency component, that is, the component of the driving frequency of the electric motor 20 in the DC signal correlated with the current of the electric motor 20 has decreased. For example, when using the AC signal correlated with the current of the electric motor 20, the control device 40 determines whether there is a decrease in a particular frequency component, that is, the frequency component that deviates, by an amount corresponding to the driving frequency of the electric motor 20, with respect to the fundamental wave frequency when the electric motor 20 is electrically driven, in the AC signal correlated with the current of the electric motor 20.

Further, the control device 40 may determine the decrease of a component of the driving frequency of the electric motor 20 in the compression torque of the compressor 10 by decrease of a particular frequency component of the vibration of the compressor 10 or a device (member) in the vicinity of the compressor 10 or a sound in the vicinity of the compressor 10. Specifically, the control device 40 may determine a decrease in a particular frequency component, that is, in the component of the driving frequency of the electric motor 20 in the compression torque of the compressor 10 by a decrease in the same frequency component of the driving frequency of the electric motor 20 in the vibration or sound in the compressor 10 or in the vicinity of the compressor 10. In this case, a vibration sensor for detecting vibration and a microphone for collecting sound, etc., are installed in the compressor 10 or near the compressor 10, and the detection signal is taken into the control device 40.

[Functions]

Next, the functions of the anomaly determination system 1 (the control device 40) according to the present embodiment will be described.

In the present embodiment, the anomaly determining unit 403 determines the anomaly of the mechanical element of the compressor 10 based on the electrical feature amount of the electrically driven compressor 10. Specifically, the electrical feature amount is a particular frequency component of a signal that is correlated with the current of the electric motor 20 driving the compressor 10, and the particular frequency component is a component of a predetermined positive integral multiple of the rotational frequency of the compressor 10. Then, the anomaly determining unit 403 makes an anomaly determination in consideration of the variation in the relationship between the anomaly of the mechanical element and the electrical feature amount of the compressor 10 caused by the change in the rotational frequency of the compressor 10.

This enables the control device 40 to consider the variation in the relationship between the anomaly of the mechanical element and the electrical feature amount of the compressor 10 caused by the change in the rotational frequency of the compressor 10, when making a determination relating to the anomaly of the compressor 10 based on the electrical feature amount. Therefore, the control device 40 can improve the accuracy of the determination relating to the anomaly of the compressor 10.

Further, in the present embodiment, the variation in the relationship between the anomaly of the mechanical element and the electrical feature amount of the compressor 10 caused by the change in the rotational frequency of the compressor 10, may be a deviation of the relationship between the anomaly of the mechanical element and the electrical feature amount of the compressor from a predetermined reference state, caused by the change in the rotational frequency of the compressor 10. Further, the predetermined reference state may be the relationship between the anomaly of the mechanical element and the electrical feature amount at a particular rotational frequency.

Accordingly, the control device 40 can make an anomaly determination by using, as a reference, the relationship between the anomaly of the mechanical element and the electrical feature amount at a particular rotational frequency, taking into consideration the deviation of the relationship between the anomaly of the mechanical element and the electrical feature amount in line with the change of the actual rotational frequency of the compressor 10.

Further, in the present embodiment, the correcting unit 402 may correct the deviation of the relationship between the anomaly of the mechanical element and the electrical feature amount from the predetermined reference state caused by the change in the rotational frequency of the compressor 10. Then, the anomaly determining unit 403 may perform the anomaly determination based on the relationship between the anomaly of the mechanical element and the electrical feature amount, for which the deviation has been corrected by the correcting unit 402.

Accordingly, the control device 40 can specifically make an anomaly determination considering the variation in the relationship between the anomaly of the mechanical element and the electrical feature amount of the compressor 10 caused by the change in the rotational frequency of the compressor 10.

Further, in the present embodiment, the determination reference generating unit 406 may generate a determination reference for making a determination from the electrical feature amount based on the relationship between the operation state of the compressor 10 and the electrical feature amount in a normal state. Further, the correcting unit 402 may correct the electrical feature amount or the determination reference so as to correct the deviation of the relationship between the anomaly of the compressor 10 and the determination reference caused by the change in the rotational frequency of the compressor 10. Then, the anomaly determining unit 403 may determine the anomaly by comparing the electrical feature amount with the determination reference after the correction by the correcting unit 402.

Accordingly, the control device 40 can specifically make an anomaly determination considering the variation in the relationship between the anomaly of the mechanical element and the electrical feature amount of the compressor 10 caused by the change in the rotational frequency of the compressor 10.

Further, in the present embodiment, the determination reference generating unit 406 may generate a determination reference when the rotational frequency of the compressor 10 is a particular rotational frequency. Further, the correcting unit 402 may correct the electrical feature amount to a state corresponding to when the rotational frequency of the compressor 10 is a particular rotational frequency. Then, the anomaly determining unit 403 may determine the anomaly by comparing the electrical feature amount corrected by the correcting unit 402 with the determination reference.

Accordingly, the control device 40 can specifically make an anomaly determination considering the variation in the relationship between the anomaly of the mechanical element and the electrical feature amount of the compressor 10 caused by the change in the rotational frequency of the compressor 10.

Further, in the present embodiment, the determination reference generating unit 406 may generate a determination reference when the rotational frequency of the compressor 10 is a particular rotational frequency. Further, the correcting unit 402 may correct the determination reference in line with the rotational frequency of the compressor 10. Then, the anomaly determining unit 403 may determine the anomaly by comparing the electrical feature amount with the determination reference corrected by the correcting unit 402.

Accordingly, the control device 40 can specifically make an anomaly determination considering the variation in the relationship between the anomaly of the mechanical element and the electrical feature amount of the compressor 10 caused by the change in the rotational frequency of the compressor 10.

Further, in the present embodiment, the correcting unit 402 may change the amount of correction in line with the change in the rotational frequency of the compressor 10.

Thus, the correcting unit 402 can specifically correct the deviation of the relationship between the anomaly of the mechanical element and the electrical feature amount from the predetermined reference state in line with the change in the rotational frequency of the compressor 10.

Further, in the present embodiment, the operation state of the compressor 10 may include both the pressure state on the low pressure side of the compressor 10 or a state correlated with that pressure state (for example, the temperature state), and the pressure state on the high pressure side or a state correlated with that pressure state.

This allows the control device 40 to generate a determination reference considering both the pressure states of the low and high pressure sides of the compressor 10, rather than the pressure state of either one of the low or high pressure side. Therefore, the control device 40 can improve the accuracy of anomaly determination.

Further, in the present embodiment, the control device 40 may hold information relating to the boundary 801 between anomaly and normality of the compressor 10 with respect to the electrical feature amount. Specifically, the boundary 801 may vary in line with a change in the rotational frequency of the compressor 10. Then, the anomaly determining unit 403 may make a determination depending on whether the electrical feature amount is on the normal side or the anomaly side of the boundary.

This enables the control device 40 to specifically make an anomaly determination considering the variation in the relationship between the anomaly of the mechanical element and the electrical feature amount of the compressor 10 caused by the change in the rotational frequency of the compressor 10, by using, for example, information relating to the boundary 801 in which the influence of the change in the rotational frequency obtained by machine learning, is taken into consideration.

Further, in the present embodiment, the anomaly determining unit 403 may determine the anomaly in consideration of the above variation based on the mechanical characteristic of the mechanical element.

This enables the control device 40 to make an anomaly determination by taking into consideration the variation in the relationship between the anomaly of the mechanical element and the electrical feature amount of the compressor 10 caused by the change in the rotational frequency of the compressor 10 resulting from the mechanical characteristic of the mechanical element.

Further, in the present embodiment, the mechanical characteristic may include inertia of the mechanical element.

Thus, the control device 40 can make an anomaly determination in consideration of the variation in the relationship between the anomaly of the mechanical element and the electrical feature amount of the compressor 10 caused by the change in the rotational frequency of the compressor 10 resulting from the inertia of the mechanical element.

Further, in the present embodiment, the anomaly determining unit 403 may perform the anomaly determination in consideration of the above variation based on the transmission characteristic until the anomaly appears in the electrical feature amount.

This enables the control device 40 to make an anomaly determination by taking into consideration the variation in the relationship between the anomaly of the mechanical element and the electrical feature amount of the compressor 10 caused by the change in the rotational frequency of the compressor 10 resulting from the transmission characteristic until the anomaly appears in the electrical feature amount.

Further, in the present embodiment, the anomaly determining unit 403 may perform the anomaly determination in consideration of the above variation based on a function representing the transmission characteristic, which is defined in advance by at least one of the calculation based on the theoretical formula and the measurement result of the electric signal of the compressor 10.

This allows the control device 40 to specifically consider the variation in the relationship between the anomaly of the mechanical element and the electrical feature amount of the compressor 10 caused by the change in the rotational frequency of the compressor 10 resulting from the transmission characteristic until the anomaly appears in the electrical feature amount.

In the present embodiment, the anomaly of the mechanical element may be of a type of anomaly in which, as the rotational frequency of the compressor 10 becomes larger, the change in the electrical feature amount that occurs at the time of the anomaly becomes relatively small.

This enables the control device 40 to make a determination relating to the type of anomaly in which as the rotational frequency of the compressor 10 becomes larger, the change in the electrical feature amount that occurs at the time of the anomaly becomes relatively small.

Further, in the present embodiment, the signal correlated with the current of the electric motor 20 driving the compressor 10 may be a DC signal correlated with the current of the electric motor 20 electrically driving the compressor 10. Further, the particular frequency component may be one times the rotational frequency of the compressor 10. The anomaly of the mechanical element to be determined may be a decrease in the oil sealability of the compression chamber of the compressor 10 or a state in which the liquid refrigerant enters the compression chamber and the liquid refrigerant is compressed (liquid compression).

This enables the control device 40 to make a determination relating to the anomaly of a particular mechanical element (decreased oil sealability or liquid compression) by using, for example, a DC signal that is correlated with the current of the electric motor 20 such as the current vector.

Further, in the present embodiment, the signal correlated with the current of the electric motor 20 driving the compressor 10 may be an AC signal correlated with the current of the electric motor 20 electrically driving the compressor 10. Further, the particular frequency component may be a frequency component that deviates from the fundamental wave frequency of the AC signal by an amount corresponding to a component that is one times the rotational frequency of the compressor 10. The anomaly of the mechanical element to be determined may be a decrease in the oil sealability of the compression chamber of the compressor 10 or a state in which the liquid refrigerant enters the compression chamber and the liquid refrigerant is compressed (liquid compression).

This allows the control device 40 to make a determination relating to the anomaly of a particular mechanical element (decreased oil sealability or liquid compression) by using an AC signal that is correlated with the current of the electric motor 20, for example, a phase current.

Further, in the present embodiment, the anomaly determining unit 403 may determine that there is a decrease in oil sealability based on a decrease in a particular frequency component, which is a frequency component that is one times the rotational frequency of the compressor 10 in the case of a DC signal, and which is a frequency component that is deviated by an amount corresponding to a component that is one times the rotational frequency of the compressor 10, with respect to the fundamental wave frequency when the compressor 10 is electrically driven in the case of an AC signal.

This allows the control device 40 to specifically identify the decrease in the oil sealability of the compressor 10 by the decrease in the first-order harmonic component of the signal that is correlated with the current of the electric motor 20 driving the compressor 10.

Further, in the present embodiment, the signal correlated with the current of the electric motor 20 driving the compressor 10 may be a DC signal correlated with the current of the electric motor 20 electrically driving the compressor 10. Further, the particular frequency component may be a component that is two times or three times the rotational frequency of the compressor 10. Further, the anomaly of the mechanical element to be determined may be the wear of the bearing of the compressor 10.

This allows the control device 40 to make a determination relating to the anomaly of a specific mechanical element (bearing wear) by using, for example, a DC signal that is correlated with the current of the electric motor 20, such as a current vector.

Further, in the present embodiment, the signal correlated with the current of the electric motor 20 driving the compressor 10 may be an AC signal correlated with the current of the electric motor 20 electrically driving the compressor 10. The particular frequency component may be a frequency component that deviates from the fundamental wave frequency of the AC signal by a component that is two times or three times the rotational frequency of the compressor 10. Further, the anomaly of the mechanical element to be determined may be the wear of the bearing of the compressor 10.

This allows the control device 40 to make a determination relating to the anomaly of a particular mechanical element (bearing wear) by using an AC signal that is correlated with the current of the electric motor 20, for example, a phase current.

Further, in the present embodiment, the signal correlated with the current of the electric motor 20 driving the compressor 10 may be calculated based on current values of at least two or more phases of the electric motor 20 electrically driving the compressor 10. Further, the current values of at least two or more phases may be obtained based on the output of a single current detecting unit that detects a predetermined current, each correlated with all of the current values of at least two or more phases.

Thus, the control device 40 can prevent a situation in which a frequency component that does not actually exist appears in the finally calculated electrical feature amount caused by, for example, the influence of individual differences in each current sensor that detects the phase current of each phase. Therefore, by obtaining (calculating) the electrical feature amount by using only the output of a single current detector, the control device 40 can avoid making an erroneous determination relating to the anomaly of the mechanical element of the compressor 10 and make a more appropriate determination relating to the anomaly of the mechanical element of the compressor 10.

Further, in the present embodiment, the anomaly determining unit 403 may make a determination relating to the anomaly of the device on which the compressor 10 as a displacement type compressor is mounted. The compressor 10 (displacement type compressor) may have a structure in which the compression mechanism and the electric motor 20 are mechanically connected and the compression torque generated during the compression process is correlated with the motor torque generated by the electric motor 20, and a structure in which a gap is provided in the compression chamber and the compression chamber is sealed with oil. Then, the anomaly determining unit 403 may determine that there is an anomaly based on a decrease in the component of the driving frequency of the electric motor 20 in the compression torque.

Thus, the control device 40 can relatively easily identify (detect) an anomaly state of a mechanical element of the compressor 10, for example, when there is no more oil to seal the compression chamber of the compressor 10 and the compression chamber is no longer airtight.

Further, in the present embodiment, the anomaly determining unit 403 may determine the decrease of the component of the driving frequency in the compression torque by the decrease of a particular frequency component of the signal correlated with the current of the electric motor 20.

Thus, the control device 40 can identify the decrease in the component of the driving frequency in the compression torque, and specifically identify (detect) the anomaly state of the mechanical element of the compressor 10.

Further, in the present embodiment, the signal correlated with the current of the electric motor 20 may be a DC signal correlated with the current of the electric motor 20. Further, the particular frequency component may be a component of the driving frequency of the electric motor 20.

This enables the control device 40 to specifically make a determination relating to the anomaly of the mechanical element of the compressor 10 by using the first-order harmonic component of the driving frequency of the electric motor 20 in the DC signal correlated with the current of the electric motor 20, such as the current vector.

Further, in the present embodiment, the signal correlated with the current of the electric motor 20 may be an AC signal correlated with the current of the electric motor 20. The particular frequency component may be a frequency component that deviates from the fundamental wave frequency of the AC signal by the driving frequency.

This enables the control device 40 to specifically make a determination relating to the anomaly of the mechanical element of the compressor 10 by using the first-order harmonic component relating to the driving frequency in the AC signal correlated with the current of the electric motor 20, for example, the phase current.

Further, in the present embodiment, the anomaly determining unit 403 may determine the decrease of the component of the driving frequency of the electric motor 20 in the compression torque by the decrease of the particular frequency component of the vibration or sound of the compressor 10 (displacement type compressor).

Thus, the control device 40 can identify the decrease in the component of the driving frequency in the compression torque, and specifically identify (detect) the anomaly state of the mechanical element of the compressor 10.

Variation/Modification

The embodiment is described above, but it will be understood that various variations and modifications of modes and details are possible without departing from the purport and scope of the claims.

For example, in the above embodiment, anomaly determinations are made relating to a mechanical element of the compressor 10, but for other rotating machines other than the compressor 10, anomaly determinations relating to a mechanical element may be made in a similar manner.

Further, in the above examples of the embodiment and variations/modifications, the case in which the harmonic current component as the electrical feature amount of the rotating machine is used for determining the anomaly is exemplified, but other kinds of electrical feature amounts may be used as long as the anomaly of the mechanical element appears as the electrical feature.

Further, in the above examples of the embodiment and variations/modifications, the compressor 10 that is the target of anomaly determination and the control device 40 to perform the anomaly determination are installed in the same air conditioner, but the function for determining anomaly may be installed in a different place from the air conditioner including the compressor 10. For example, the function of performing the anomaly determination of the compressor 10 may be provided in the above management apparatus (an example of the anomaly determination apparatus) communicably connected through the communication device 50. In this case, the detection signal relating to the electric current of the electric motor 20 and the detection signal relating to the operation state of the compressor 10 are transmitted (uploaded) to the management apparatus through the communication device 50.

Finally, the present application claims priority based on Japanese Patent Application No. 2020-131881 filed on Aug. 3, 2020, and the entire contents of the Japanese Patent Application are hereby incorporated by reference.

DESCRIPTION OF SIGN

1 anomaly determination system
10 compressor (rotating machine)
20 electric motor
30 electric motor driving device
40 control device (anomaly determination apparatus)
50 communication device
401 electrical feature amount calculating unit
402 correcting unit
403 anomaly determining unit (determining unit)
406 determination reference generating unit (generating unit)
407 anomaly degree estimating unit (estimating unit)
801 boundary

The invention claimed is:

1. An anomaly determination apparatus comprising:
a determining unit configured make a determination relating to an anomaly of a device installed with a displacement type compressor, wherein
the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and
the determining unit determines that there is the anomaly based on a decrease in a component of a driving frequency of the electric motor in the first torque.

2. The anomaly determination apparatus according to claim 1, wherein the determining unit determines the decrease in the component of the driving frequency in the first torque, according to a decrease in a particular frequency component of a signal correlated with a current of the electric motor.

3. The anomaly determination apparatus according to claim 2, wherein
the signal is a DC signal correlated with the current of the electric motor, and
the particular frequency component is a component of the driving frequency.

4. The anomaly determination apparatus according to claim 2, wherein
the signal is an AC signal correlated with the current of the electric motor, and
the particular frequency component is a frequency component that is deviated by an amount corresponding to the driving frequency, with respect to a fundamental wave frequency of the AC signal.

5. The anomaly determination apparatus according to claim 1, wherein the determining unit determines the decrease in the component of the driving frequency in the first torque, according to a decrease in a particular frequency component of vibration or sound of the displacement type compressor.

6. An anomaly determination method performed by an anomaly determination apparatus, the anomaly determination method comprising:
making a determination relating to an anomaly of a device installed with a displacement type compressor, wherein
the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and the making the determination includes making the determination that there is an anomaly based on a decrease in a component of a driving frequency of the electric motor in the first torque.

7. A non-transitory computer-readable recording medium storing a program that causes a computer to execute a process performed in an anomaly determination apparatus, the process comprising:

making a determination relating to an anomaly of a device installed with a displacement type compressor, wherein the displacement type compressor has a structure in which a compression mechanism and an electric motor are mechanically connected, and a first torque generated in a compression process and a second torque generated by the electric motor are correlated with each other, and the displacement type compressor also has a structure in which a gap is provided in a compression chamber and the compression chamber is sealed with oil, and the making the determination includes making the determination that there is an anomaly based on a decrease in a component of a driving frequency of the electric motor in the first torque.

* * * * *